United States Patent
Tsai

(10) Patent No.: US 10,932,391 B2
(45) Date of Patent: Feb. 23, 2021

(54) LIQUID-COOLING HEAT EXCHANGE APPARATUS

(71) Applicant: COOLER MASTER CO., LTD., New Taipei (TW)

(72) Inventor: Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 91 days.

(21) Appl. No.: 16/254,786

(22) Filed: Jan. 23, 2019

(65) Prior Publication Data

US 2019/0239388 A1     Aug. 1, 2019

Related U.S. Application Data

(60) Provisional application No. 62/623,603, filed on Jan. 30, 2018.

(51) Int. Cl.
| | | |
|---|---|---|
| *F28F 7/00* | (2006.01) | |
| *H05K 7/20* | (2006.01) | |
| *H01L 23/473* | (2006.01) | |

(52) U.S. Cl.
CPC ....... *H05K 7/20272* (2013.01); *H01L 23/473* (2013.01); *H05K 7/20263* (2013.01)

(58) Field of Classification Search
CPC .............. H01L 23/473; H05K 7/20218; H05K 7/20254; H05K 7/20263; H05K 7/20272; H05K 7/20281; F28D 2021/0028
See application file for complete search history.

(56) References Cited

U.S. PATENT DOCUMENTS

| | | | | |
|---|---|---|---|---|
| 9,677,820 B2* | 6/2017 | Tsai | ......................... | F28F 13/06 |
| 2006/0254752 A1* | 11/2006 | Narakino | ................ | F28D 1/035 |
| | | | | 165/80.4 |
| 2007/0227709 A1* | 10/2007 | Upadhya | ............ | H05K 7/20154 |
| | | | | 165/121 |
| 2013/0235527 A1* | 9/2013 | Wagner | .................. | H05K 7/209 |

FOREIGN PATENT DOCUMENTS

| | | |
|---|---|---|
| TW | M508885 U | 9/2015 |
| TW | I607195 B | 12/2017 |

* cited by examiner

*Primary Examiner* — Henry T Crenshaw
*Assistant Examiner* — Kamran Tavakoldavani
(74) *Attorney, Agent, or Firm* — Dickinson Wright PLLC

(57) ABSTRACT

A liquid cooling heat exchange apparatus has a water block set and a liquid pump module. The water block set has a heat transfer surface configured to exchange heat with a cooling liquid. The liquid pump module is securely mounted on the water block set and has a flow-directing containment area and pumps. The flow-directing containment area forms flow-directing containment recesses and the pumps correspond to the flow-directing containment recesses. Therefore, pumps are connected in series or parallel so that the pumps can juxtapose with each other, which lessens the entire thickness and allows the liquid cooling heat exchange apparatus to be utilized in a narrow space. Besides, with the connected pumps, an amount and a speed of the flow may be increased and dissipate more heat. Even if part of the pumps malfunctions, the remaining pump(s) can maintain a basic amount and speed of the flow.

15 Claims, 18 Drawing Sheets

LIQUID-COOLING HEAT EXCHANGE APPARATUS

CROSS-REFERENCE TO RELATED APPLICATIONS

This application is based upon and claims priority under 35 U.S.C. 119 from U.S. Provisional Application No. 62/623,603 filed on Jan. 30, 2018, which is hereby specifically incorporated herein by this reference thereto.

BACKGROUND OF THE INVENTION

1. Field of the Invention

The invention relates to liquid heat exchange apparatuses, and particularly, relates to interchangeable liquid pump modules and water block sets of the liquid heat exchange apparatuses.

2. Description of the Prior Arts

During operation of a computer or electronic device, the heat that is generated inside of a CPU or any other processing unit must be carried away fast and efficiently, to keep the temperature within a design range specified by the manufacturer. Several techniques have been developed for cooling CPUs. One such technique is an air-cooling system, wherein a heat sink is in thermal contact with the CPU and transports heat away from the CPU and a fan is mounted on top of the heat sink to remove heat from the heat sink by blowing air through segments thereof. This air-cooling system may be sufficient for everyday uses; however, it can be noisy and becomes less effective with higher CPU speeds and greater heat output. Another technique is to use cooling liquid to cool the CPU by forcing the cooling liquid to circulate inside a closed system by a pumping unit, wherein the closed system also has a heat exchanger in which the cooling liquid is circulated thereabout.

Generally, liquid heat exchange systems may be less noisy and more efficient than an air-cooling system. However, conventional liquid heat exchange system designs consist of many components, which increases total installation time, risks for leakage, and loss of parts. Additionally, increasing heat dissipation efficiency through liquid flow design of the liquid heat exchange systems has generally reached a bottleneck. For example, some heat sources having higher heating efficiency need to improve heat dissipation efficiency correspondingly via increasing a flow amount of a working flow. To increase the amount of the flow, pumps are connected in series or in parallel. However, an inlet of the conventional pump is arranged at a center of the pump. Therefore, to connect multiple conventional pumps, the pumps are stacked and overall thickness is increased, so the stacked pumps cannot be utilized in a narrow space.

There is demand for a liquid heat exchange apparatus to solve the aforementioned problems.

SUMMARY OF THE INVENTION

The main objective of the present invention is to provide a liquid cooling heat exchange apparatus that has two or more pumps to increase a flow amount of a working flow, so the liquid cooling heat exchange apparatus may be equipped on a high heating efficiency device.

The liquid cooling heat exchange apparatus configured to be flown through by a cooling liquid has a water block set and a liquid pump module. The water block set has a heat transfer surface, an inlet, and an outlet. The heat transfer surface is configured to exchange heat with the cooling liquid. Wherein the cooling liquid flows into the water block set via the inlet of the water block set and then passes through the heat transfer surface. The cooling liquid flows out of the water block set via the outlet of the water block set. A liquid pump module is securely mounted on the water block set and comprises a flow-directing containment area. The flow-directing containment area is securely mounted on the water block set and comprises a flow-directing containment area body, a plurality of pumps, a flow-directing containment plate. The flow-directing containment area body forms a plurality of flow-directing containment recesses, a cooling liquid outlet, and a cooling liquid inlet. The flow-directing containment recesses is on a surface, facing the water block set, of the flow-directing containment area body and is concaved away from the water block set. The cooling liquid outlet communicates with the outlet of the water block set. The pumps correspond to the flow-directing containment recesses in location respectively. Each one of the pumps comprises an impeller. Each impeller is in a respective one of the flow-directing containment recesses. The flow-directing containment plate is disposed between the impellers of the pumps and the water block set and covers the flow-directing containment recesses. The flow-directing containment plate comprises an inlet channel and at least one outlet channel. The inlet channel on a surface, facing the water block set, of the flow-directing containment plate. The cooling liquid inlet of the flow-directing containment area body communicates with at least one of the flow-directing containment recesses via the inlet channel. The at least one outlet channel is on the surface, facing the water block set, of the flow-directing containment plate. The flow-directing containment recesses communicate with the inlet of the water block set via the at least one outlet channel.

Therefore, one of the advantages of the present patent invention is that the liquid cooling heat exchange apparatus has two or more pumps connected in series or in parallel so that the pumps can juxtapose with each other rather than stack in an axial direction, which lessens the entire thickness and allows the liquid cooling heat exchange apparatus to be utilized in a narrow space. Besides, with the connected pumps, an amount and a speed of the flow may be improved, so the liquid cooling heat exchange apparatus can be used on a high heat efficiency source. Furthermore, if part of the pumps malfunctions, the remaining pump(s) can maintain a basic amount and speed of the flow, and thereby the maintenance staff may have adequate time to troubleshoot.

Other objectives, advantages and novel features of the invention will become more apparent from the following detailed description when taken in conjunction with the accompanying drawings.

It is understood that the following disclosure provides many different embodiments, or examples, for implementing different features of the invention. Specific examples of devices and arrangements are described below to simplify the present disclosure. These are, of course, merely examples, which are not intended to be limiting. For example, the formation of a first feature over or on a second feature in the description that follows can include embodiments in which the first and second features are formed in direct contact, and can also include embodiments in which additional features are formed between the first and second features, such that the first and second features are not in direct contact. In addition, the present disclosure can repeat reference numerals and/or letters in the various examples.

This repetition is for the purpose of simplicity and clarity and does not in itself dictate a relationship between the various embodiments and/or configurations discussed. It is intended that the scope of the present technology be defined by the claims appended hereto and their equivalents.

DETAILED DESCRIPTION OF THE PREFERRED EMBODIMENTS

Figure 1:
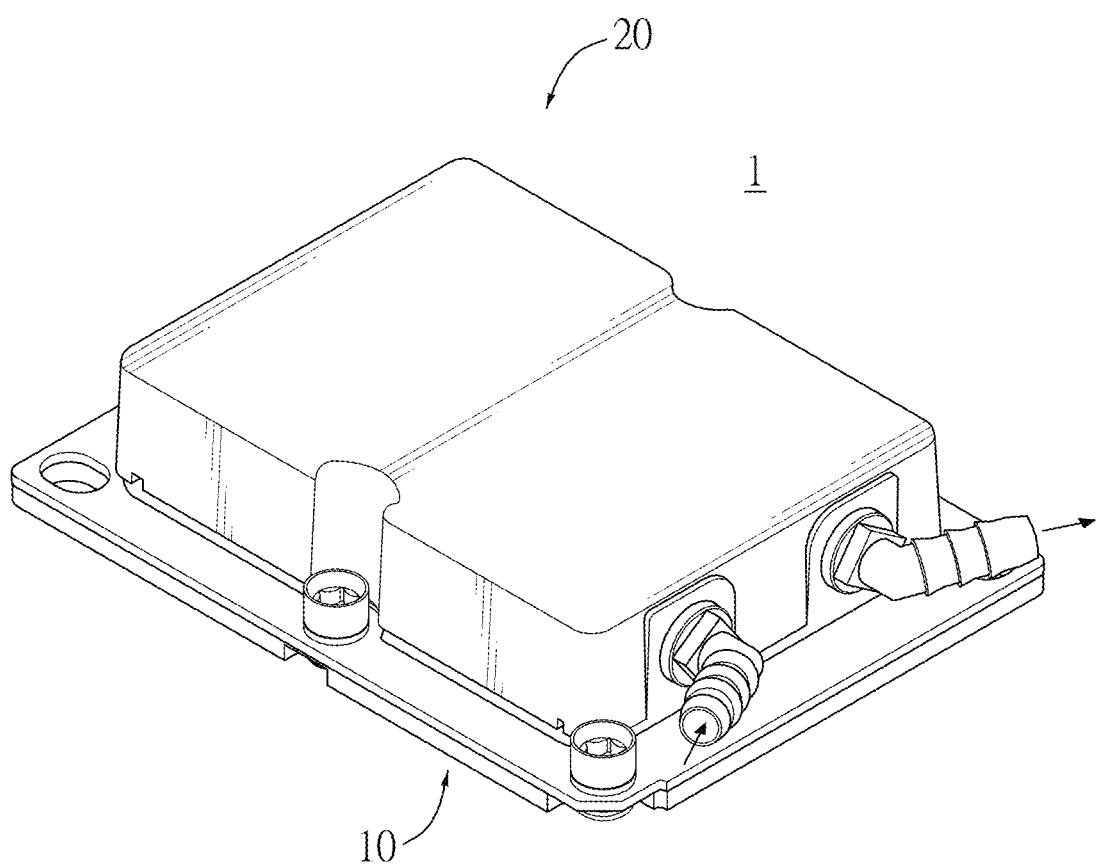
FIG. 1 is a perspective view of a liquid cooling heat exchange apparatus in accordance with a first embodiment of the present invention.

Referring to FIGS. 1 to 8B, a liquid cooling heat exchange apparatus 1 in accordance with a first embodiment of the present invention is provided and comprises a water block set 10 and a liquid pump module 20. The water block set 10 and the liquid pump module 20 are interchangeable. In other words, a water block set in any embodiment may be combined with or mounted on a liquid pump module in any embodiment to form a liquid cooling heat exchange apparatus 1 according to different design and manufacturing requirements. A liquid cooling heat exchange apparatus 2 in accordance with a second embodiment of the present invention as shown in FIGS. 9 to 16B may comprise a water block set 30 and a liquid pump module 40. In the present invention, the water block set and the liquid pump module are modularized, so the water block set and the liquid pump module in different embodiments may be mounted together, e.g., the water block set 10 may be mounted on the liquid pump module 40 or the water block set 30 may be mounted on the liquid pump module 20.

Figure 2:
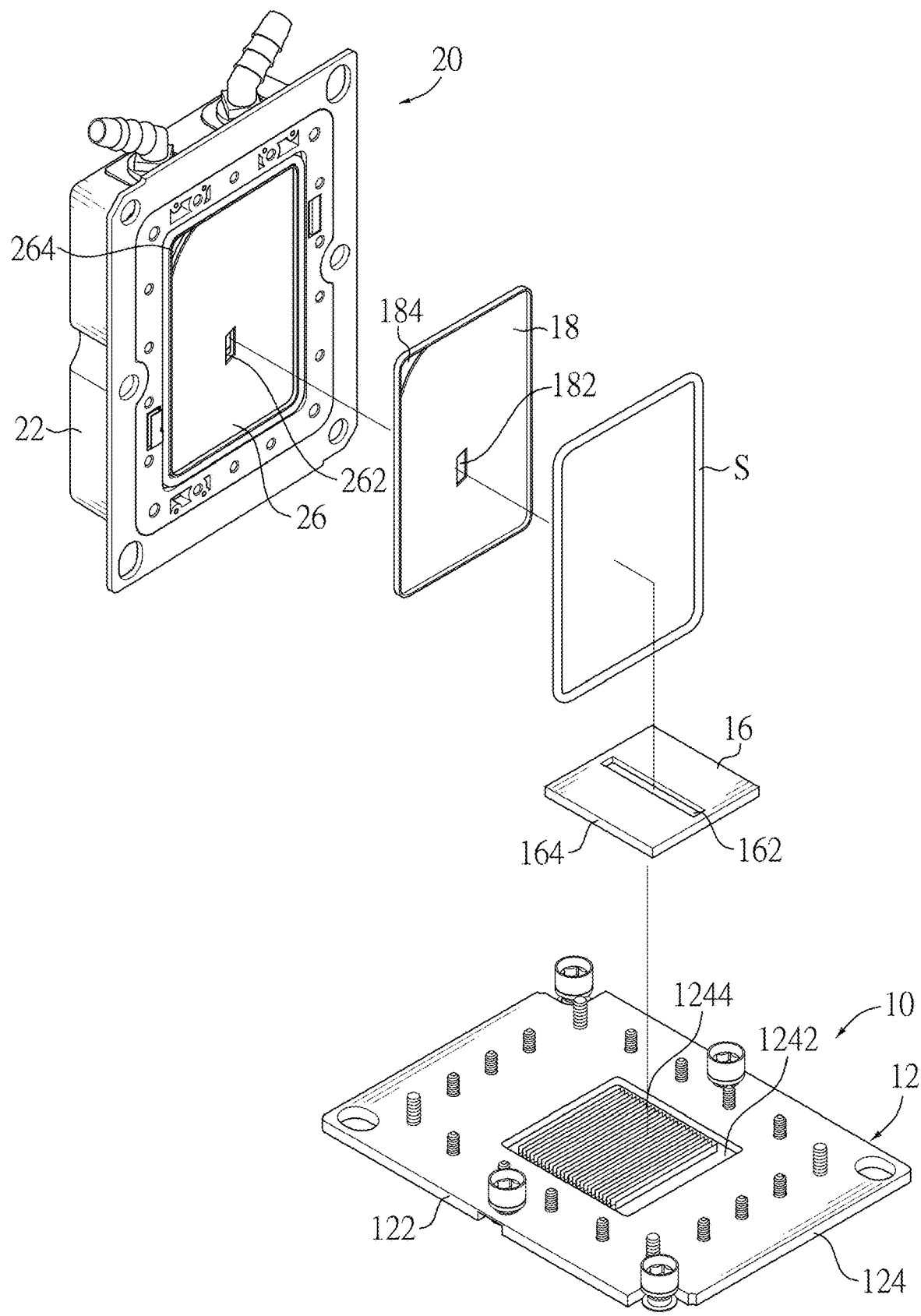
FIG. 2 is an exploded view of the liquid cooling heat exchange apparatus in FIG. 1.

Referring to FIG. 2, in the first embodiment, the water block set 10 has a water block base 12, an encasement 16, and a water block set cover 18. The water block base 12 has a first surface 122 and a second surface 124. The first surface 122 is adaptable to be in thermal contact with a thermal load and the second surface 124 is provided with heat transfer surfaces thereon. The water block base 12 is preferably made from a heat conducting material having a relative high heat thermal conductivity such as copper or aluminum with a flat first surface 122 for abutting a free surface of a heat generating component such as a CPU. Meanwhile, the heat transfer surfaces of the second surface 124 may comprise one or more of fins, vanes, blades, channels, ducts, pins, posts, covers, slots, protrusions, recesses, perforations, holes, textured surfaces, segmented elements, staggered elements, or smooth surfaces. One or more flow gaskets may also be provided among the heat transfer surfaces. Similarly, please refer to FIG. 10. In the second embodiment, the water block set 30 comprises a water block base 32, an encasement 36, and a water block set cover 38. Hereinafter the embodiments are illustrated with fins as the heat transfer surfaces.

Figure 10:
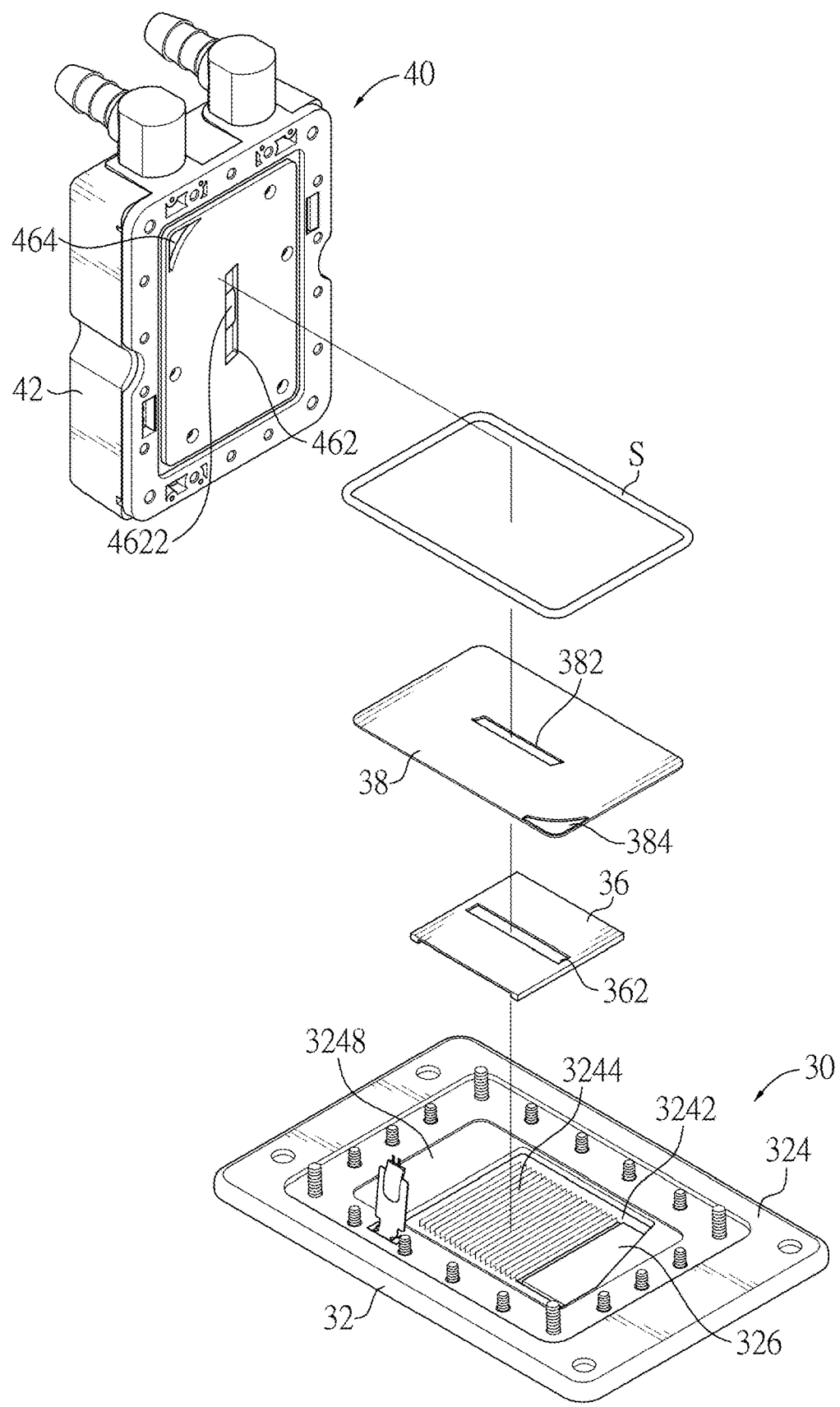
FIG. 10 is an exploded view of the liquid cooling heat exchange apparatus in FIG. 9.

In the first embodiment, the heat transfer surfaces are provided in a second-level indented water block heat exchange area 1242 of the second surface 124. In the embodiment, the heat transfer surfaces comprise a main heat transfer area 1244 in the center of the second-level indented water block heat exchange area 1242 having a plurality of heat-dissipating fins surrounded by inner walls of the second-level indented water block heat exchange area 1242. However, the embodiments are not limited thereto. Referring to FIG. 10, in the second embodiment, in addition to the main heat transfer area 3244 and the walls in the second-level indented water block heat exchange area 3242 of the second surface 324, the heat transfer surfaces also comprise an irregular pentagon-shaped ramp 326 disposed on a longitudinal side of the heat-dissipating fins in the second-level indented water block heat exchange area 3242. Further, the irregular pentagon-shaped ramp 326 is a concaved surface to ensure there is an adequate space, for flowed by the working liquid, on the main heat transfer area 3244. A first-level indented water block heat exchange area 3248 surrounds the second-level indented water block heat exchange area 3242. The water block set cover 38 may be received in the first-level indented water block heat exchange area 3248, so that an upper surface of the water block set cover 38 is flush with an upper surface of the water block base 32.

Referring to FIG. 2 again, in the first embodiment, the encasement 16 has a middle longitudinal split opening 162 and entirely encases the main heat transfer area 1244 of the heat transfer surfaces. The encasement 16 may be stuffed into a space between the water block set cover 18 and the main heat transfer area 1244 to prevent the working liquid from overflowing. Precisely, the encasement 16 has a concaved portion (not shown in the drawings), side walls of the concaved portion surround the main heat transfer area 1244, and a bottom wall of the concaved portion covers the main heat transfer area 1244. In the first embodiment, a gap is formed between lower side walls of the encasement 16 and the main heat transfer area 1244, and multiple side channels are formed around the main heat transfer area 1244. Precisely, a four-sided channel structure is formed around the heat-dissipating fins to allow cooling liquid to flow into and throughout not only the main heat transfer area 1244 through the middle longitudinal split opening 162, but also the side and top portions of the encasement 16. However, the embodiments are not limited thereto. Referring to FIG. 10 again, in the second embodiment, two opposite side walls of the concaved portion of the encasement 36, parallel to the middle longitudinal split opening 362, are removed to encase the main heat transfer area 3244 of the heat transfer surfaces, and thus two ends of each gap between two of the heat-dissipating fins are opened. Here, a two-sided channel system is formed along the removed side areas allowing cooling liquid to flow into the middle longitudinal split opening 362 and out toward the sides of the encasement 36 directly into side channels to further direct the cooling liquid toward an outlet 384 of the water block set cover 38 over the irregular pentagon-shaped ramp 326. Accordingly, other shapes, sizes and textures for the ramps, channels, segments and walls may be implemented as a part of the heat transfer surfaces to further improve heat exchange. The encasement may be made of, for example, plastic or metal.

Referring to FIG. 2, in the first embodiment, the water block set cover 18 has two openings. One of the openings is configured for the cooling liquid to enter a space between the water block set cover 18 and the water block base 12 and the other one of the openings is configured for the cooling liquid to exit said space. The two openings are respectively defined as an inlet 182 and one aforesaid outlet 184. The inlet 182 is aligned to the middle longitudinal split opening 162 of the encasement 16 and the water block set cover 18 fittingly covers the encasement 16 and the heat transfer surfaces of the second surface 124. However, the embodiments are not limited thereto, as the inlet 182 having other shapes and sizes may be used. In the second embodiment as shown in FIG. 10, the water block set cover 38 has an inlet 382 and an outlet 384. As long as cooling liquid is able to freely flow through the inlet 182/382 of the water block set cover 18/38 and through the middle longitudinal split opening 162/362 of the encasement 16/36 and then out from the outlet 184/384 of the water block set cover 18/38, the inlet split opening may be designed in other shapes and sizes. The water block set cover 18/38 may be made of, for example, plastic or metal. In the first embodiment, the water block set 10 is secured to the liquid pump module 20 by bolts. However, other convenient fastening means may be used. A rectangular sealant S in the form of a gasket is used for the connection between the water block set 10 and the liquid pump module 20 forming a liquid-tight connection. The rectangular sealant S tightly fits into an indented bottom rim of the liquid pump module 20. The water block set cover 18 tightly fits within the rectangular sealant S and is disposed flush with a liquid heat exchange cover of the liquid heat exchange module when connected.

In the first embodiment as shown in FIG. 2, cooling liquid is pumped down into the inlet 182 of the water block set cover 18 and then correspondingly into the middle longitudinal split opening 162 of the encasement 16. After that, the working liquid is forced to flow through the heat-dissipating fins and pick up heat energy before exiting the encasement 16. Then, the working liquid flows toward the outlet 184 of the water block set cover 18.

In the first embodiment, increased turbulence created by the encasement 16 and heat transfer surfaces improves the exchange of heat between the second surface 124 of the water block base 12 and the cooling liquid.

Figure 3:
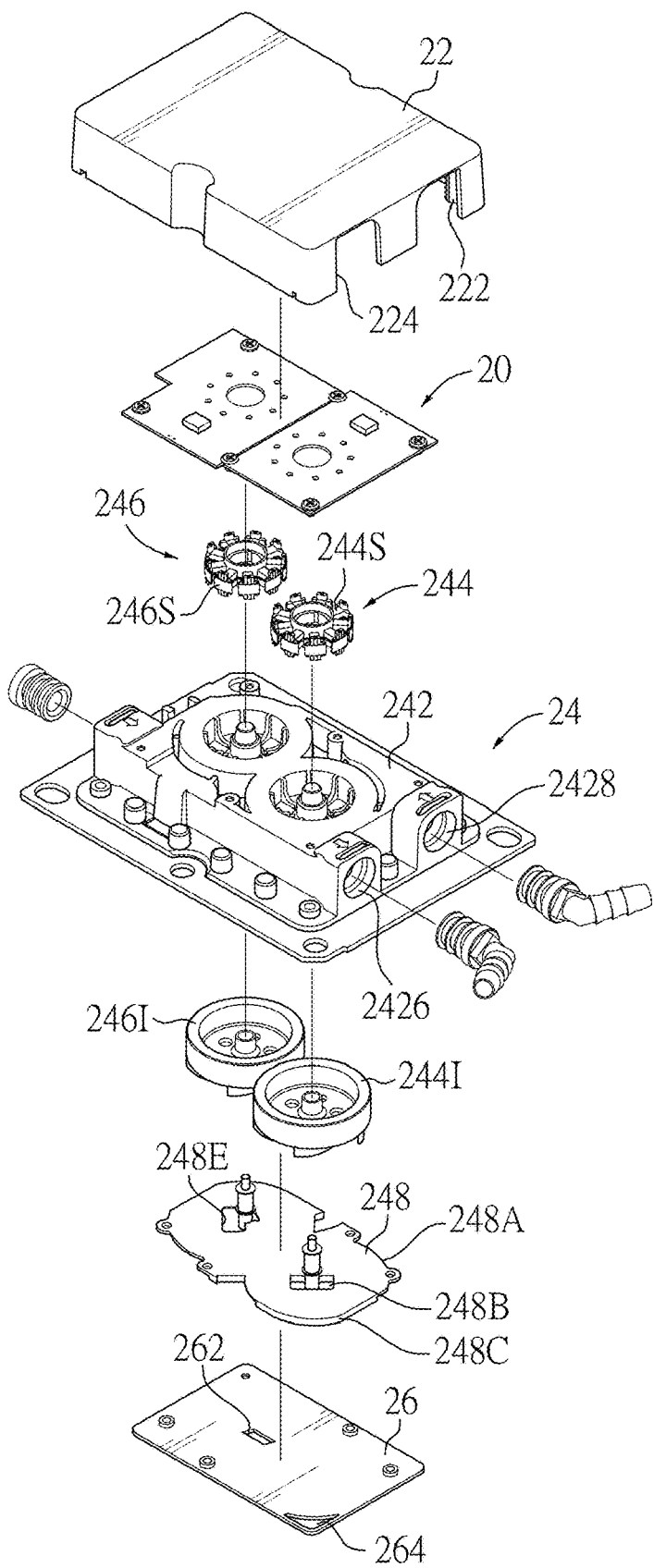
FIG. 3 is an exploded view of a liquid pump module of the liquid cooling heat exchange apparatus in FIG. 1.
Figure 4:
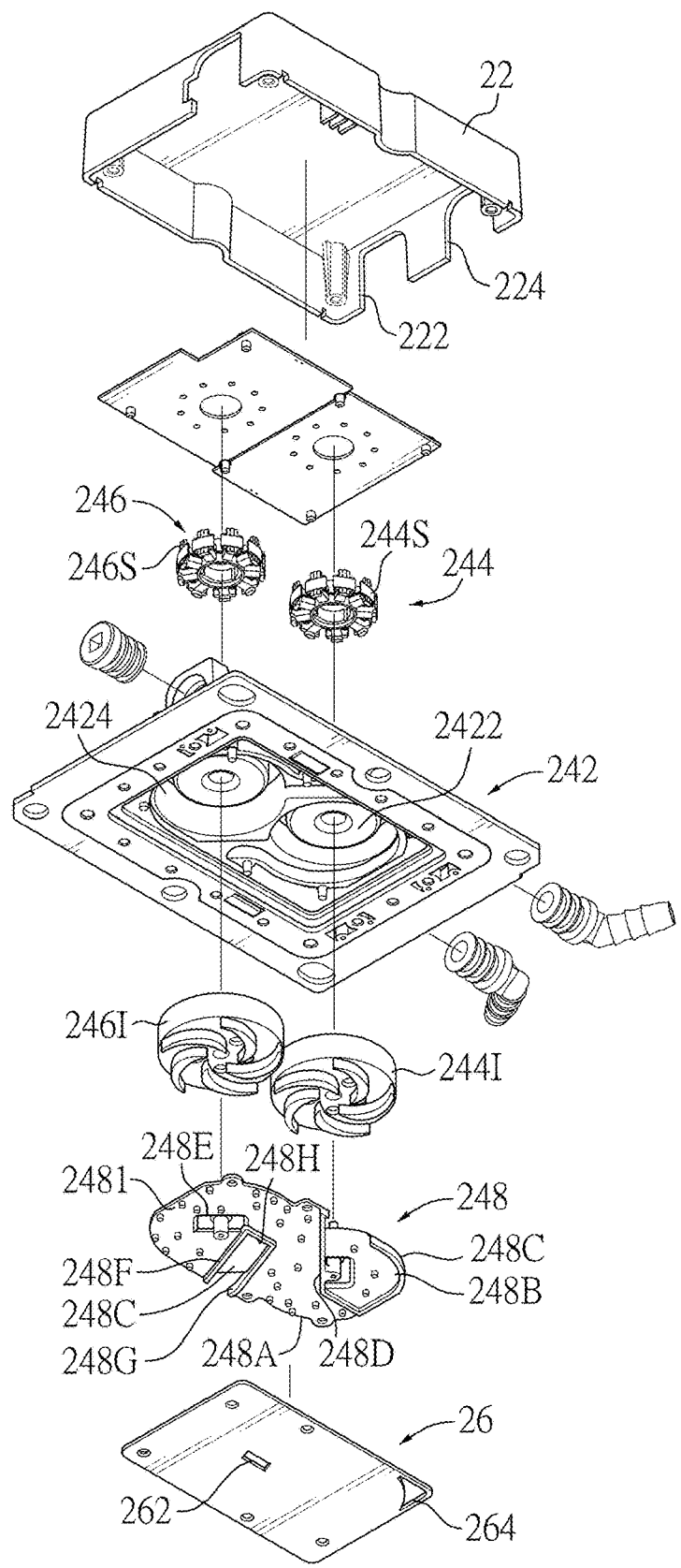
FIG. 4 is another exploded view of a liquid pump module of the liquid cooling heat exchange apparatus in FIG. 1.
Figure 5A:
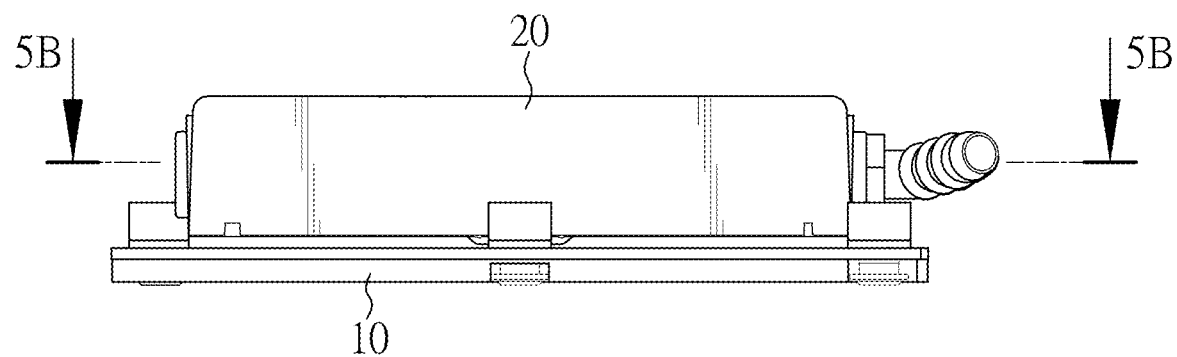
FIG. 5A is a side view of the liquid cooling heat exchange apparatus in FIG. 1.
Figure 5B:
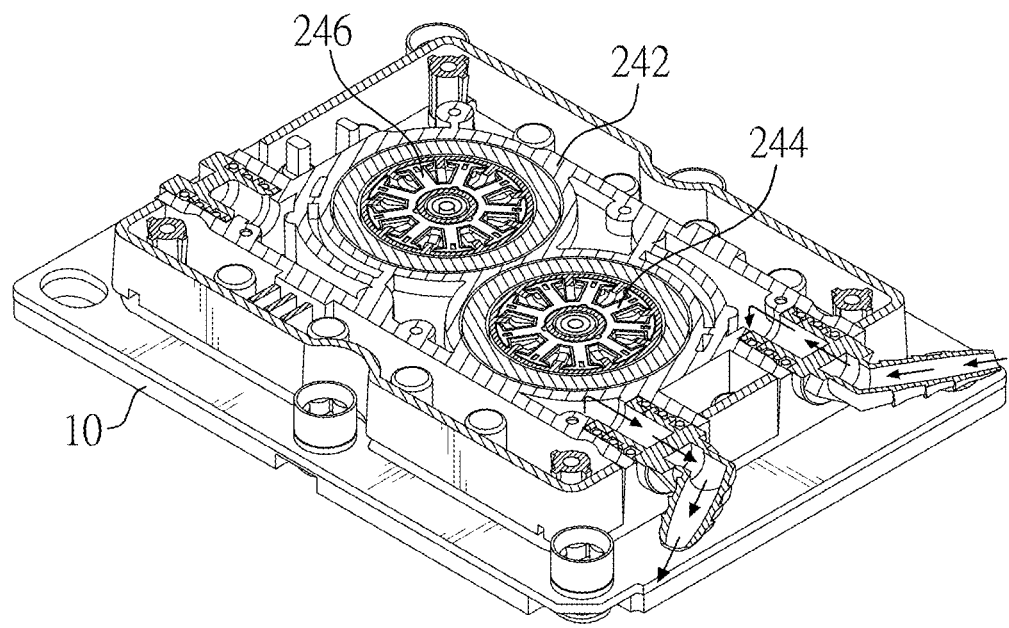
FIG. 5B is a sectional view of the liquid cooling heat exchange apparatus in FIG. 5A across line 5B-5B.

Referring to FIGS. 3 and 4, in the first embodiment, the liquid pump module 20 has a casing 22, a flow-directing containment area 24, and a liquid pump module cover 26. The casing 22 may encase the flow-directing containment area 24 having at least one cooling liquid inlet cutout 222 and one cooling liquid outlet cutout 224. The at least one cooling liquid inlet cutout 222 and the cooling liquid outlet cutout 224 are disposed on the same side of the casing 22. However, the embodiments are not limited thereto. The side that has the cooling liquid inlet cutout 222 and the cooling liquid outlet cutout 224 is defined as a near side or a near end, and an opposite side on the casing 22 is defined as a far side or a far end. Additional cooling liquid cutouts may be made; as an example and not be limiting, an alternative cooling liquid inlet cutout may be disposed on an opposing side and aligned with the cooling liquid outlet cutout 224, according to different designs and specifications. The casing 22, covers the flow-directing containment area 24 and may be made of, for example, plastic or metal. Then please refer to FIGS. 11 and 12; in the second embodiment, the liquid pump module 40 comprises a casing 42, a flow-directing containment area 44, and a liquid pump module cover 46.

Please refer to FIGS. 2 to 4; in the first embodiment, the liquid pump module cover 26 is mounted between the flow-directing containment area 24 and the water block set cover 18, and has at least one communicating opening 262 and an outlet opening 264. The communicating opening 262 of the liquid pump module cover 26, the inlet 182 of the water block set cover 18, and the middle longitudinal split opening 162 of the encasement 16 are aligned to each other. The liquid pump module cover 26 fittingly covers the water block set cover 18, the encasement 16, and the heat transfer surfaces of the second surface 124 of the water block base 12. However, the embodiments are not limited thereto, as inlet split openings in other shapes and sizes may be adopted. The outlet opening 264 of the liquid pump module cover 26 may be arranged at a corner of the liquid pump module cover 26, e.g. a corner adjacent to the near side, and thus the outlet opening 264 may be aligned to the outlet 184 of the water block set cover 18. The liquid pump module cover 26 covers the whole water block set cover 18, the encasement 16, and the heat transfer surfaces of the second surface 124 of the water block base 12. However, it is not limited thereto in another embodiment, as the outlet opening 264 may be in other shapes or dimensions.

Figure 11:
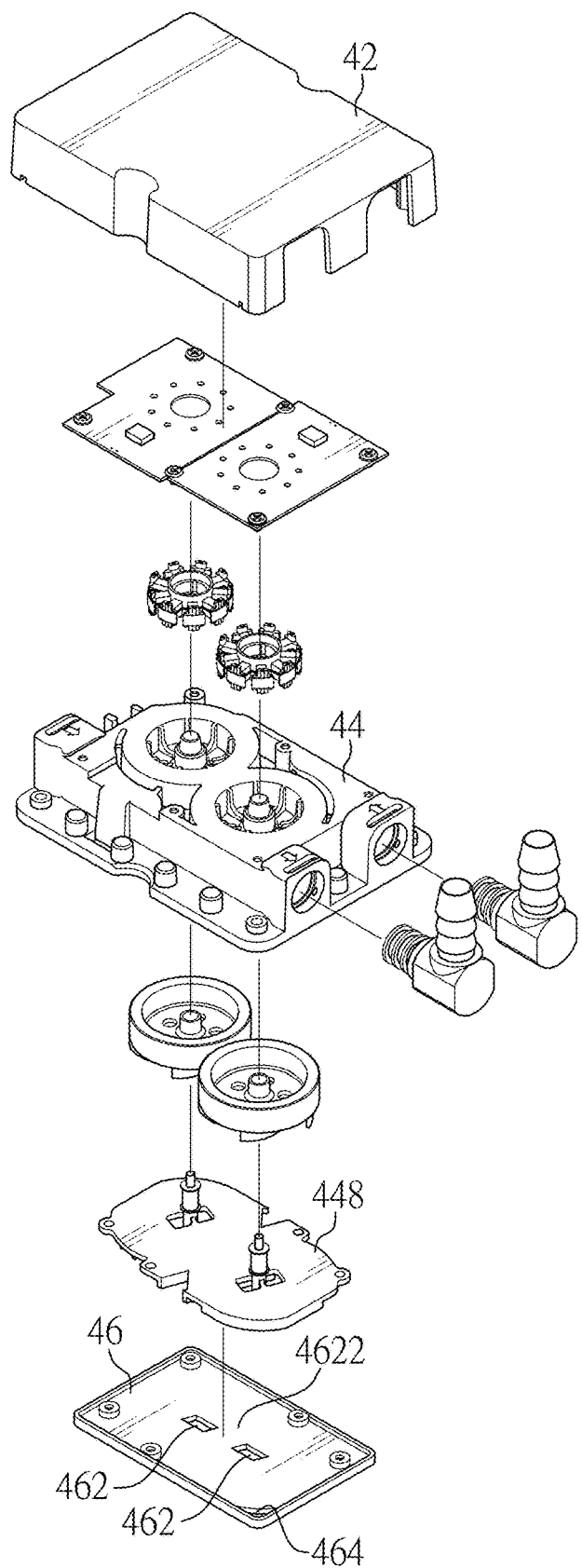
FIG. 11 is an exploded view of a liquid pump module of the liquid cooling heat exchange apparatus in FIG. 9.
Figure 12:
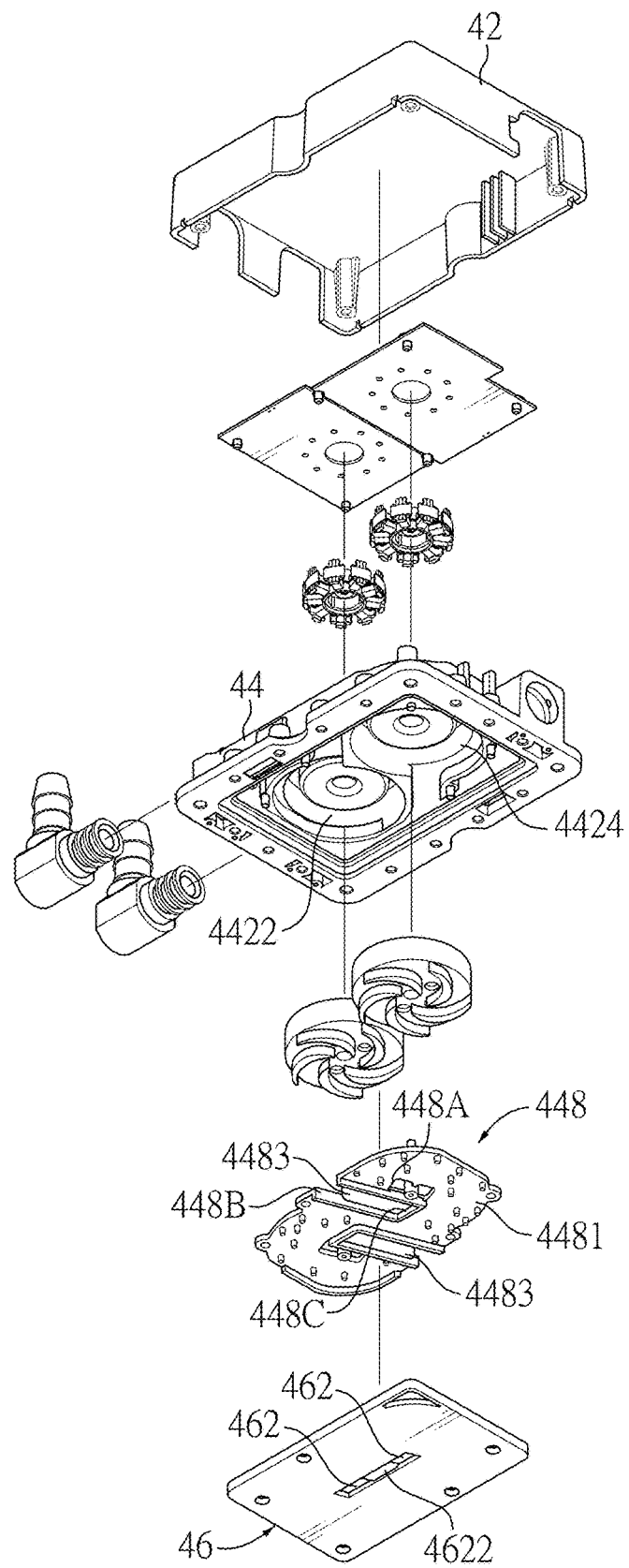
FIG. 12 is another exploded view of a liquid pump module of the liquid cooling heat exchange apparatus in FIG. 9.
Figure 13A:
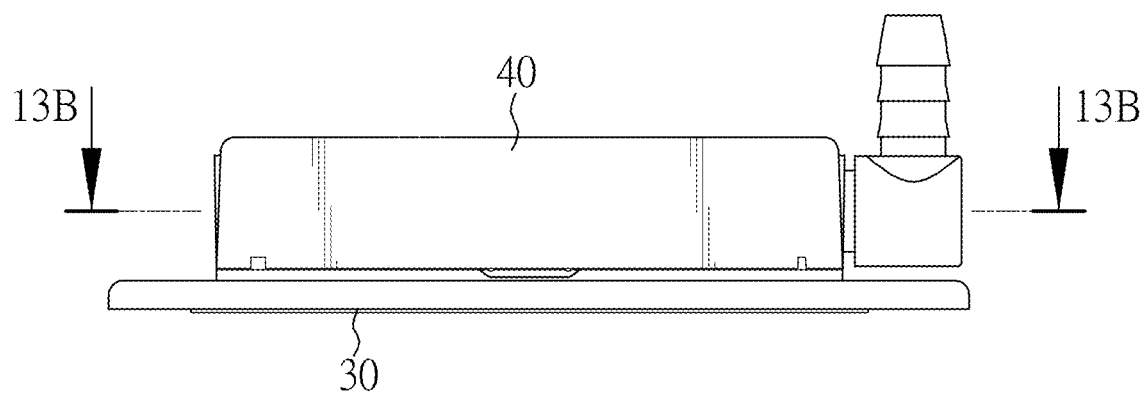
FIG. 13A is a side view of the liquid cooling heat exchange apparatus in FIG. 9.
Figure 13B:
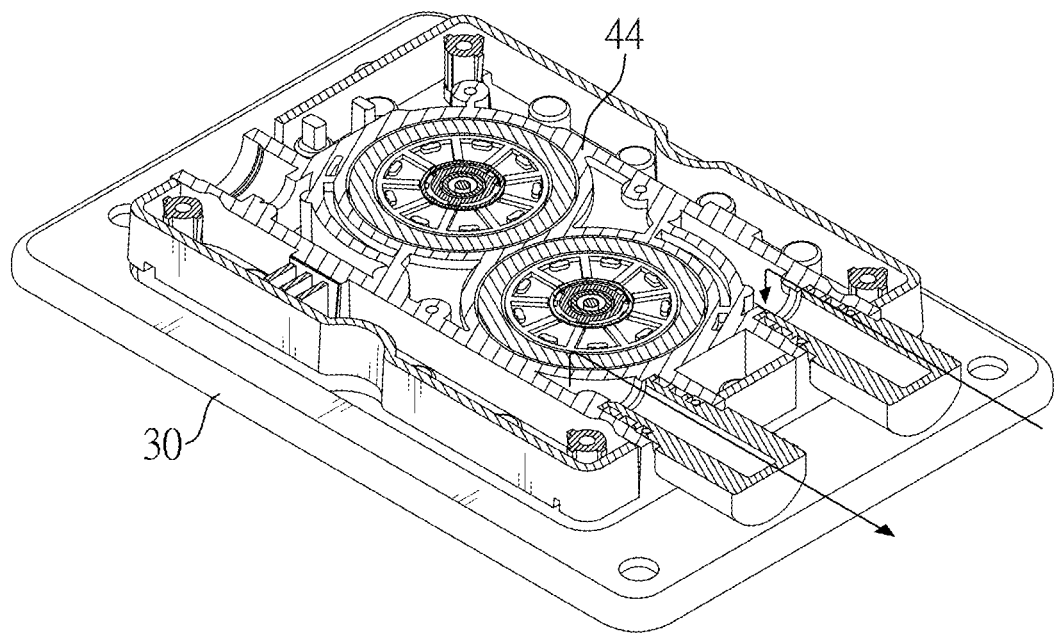
FIG. 13B is a sectional view of the liquid cooling heat exchange apparatus in FIG. 13A across line 13B-13B.
Figure 14A:
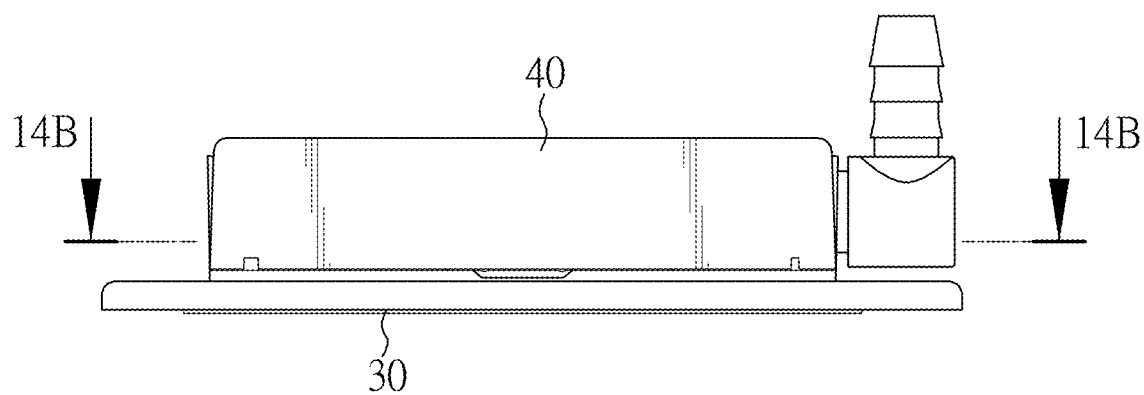
FIG. 14A is a side view of the liquid cooling heat exchange apparatus in FIG. 9.
Figure 14B:
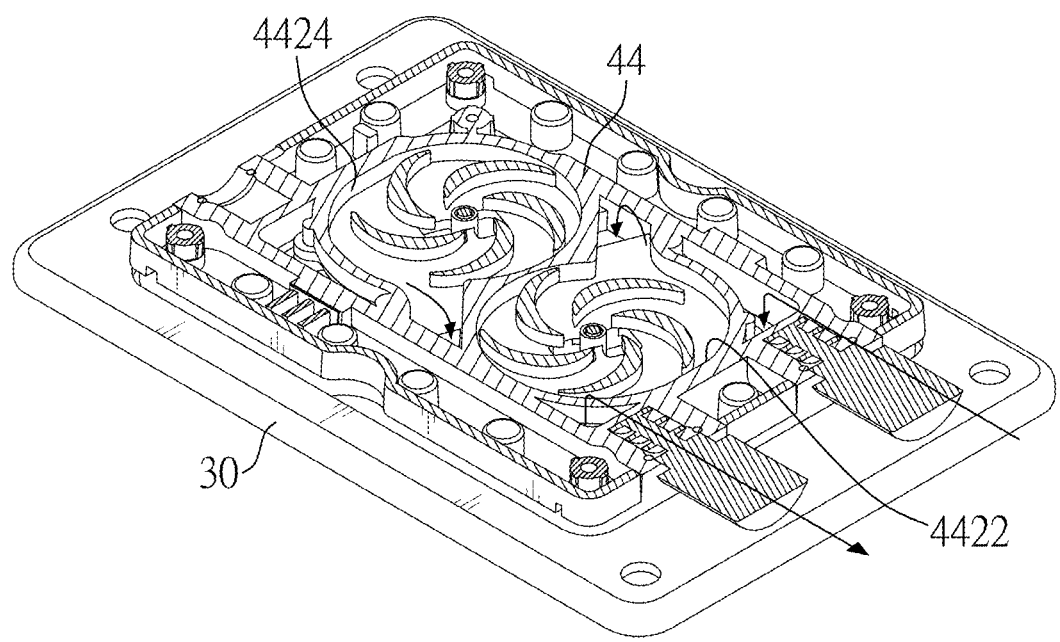
FIG. 14B is a sectional view of the liquid cooling heat exchange apparatus in FIG. 14A across line 14B-14B.
Figure 15A:
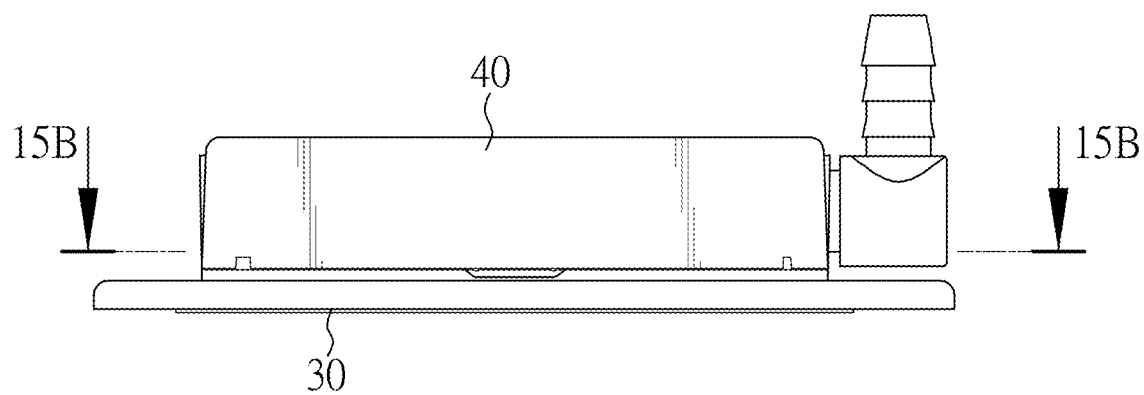
FIG. 15A is a side view of the liquid cooling heat exchange apparatus in FIG. 9.
Figure 15B:
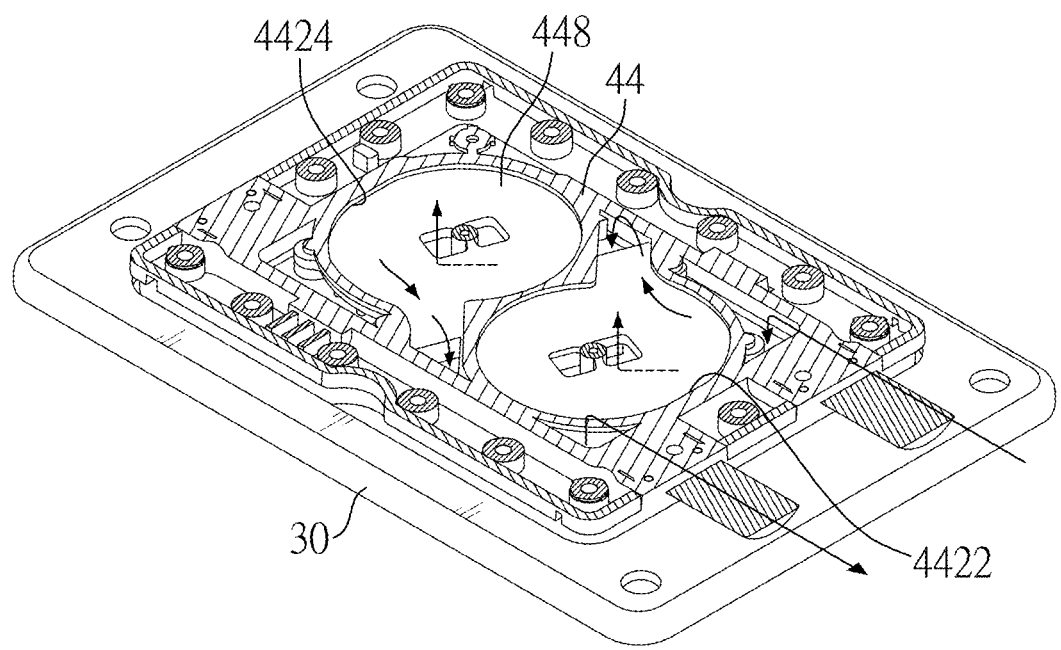
FIG. 15B is a sectional view of the liquid cooling heat exchange apparatus in FIG. 15A across line 15B-15B.
Figure 16A:
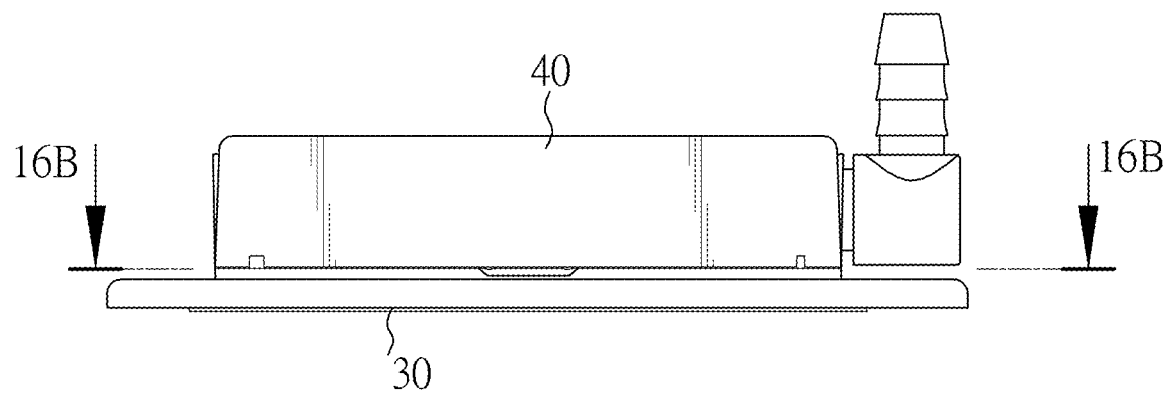
FIG. 16A is a side view of the liquid cooling heat exchange apparatus in FIG. 9.
Figure 16B:
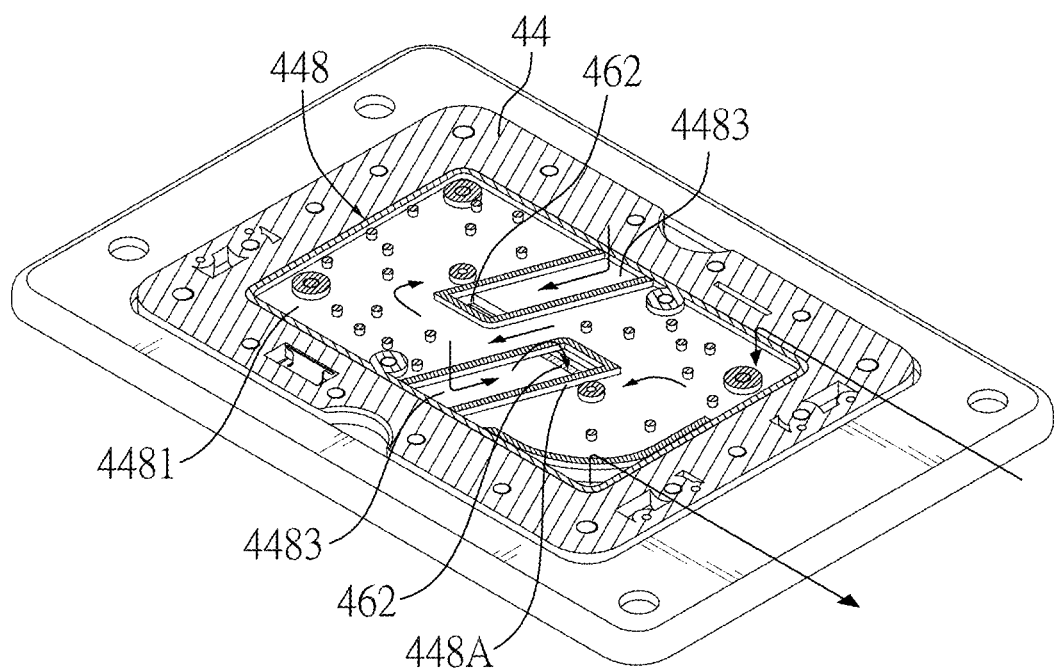
FIG. 16B is a sectional view of the liquid cooling heat exchange apparatus in FIG. 16A across line 16B-16B.

In the second embodiment, as shown in FIGS. 10 to 12, the liquid pump module cover 46 has a plurality of communicating openings 462, a middle barrier 4622, and an outlet opening 464. The communicating openings 462 match the inlet 382 of the water block set cover 38. The middle barrier 4622 is between the plurality of communicating openings 462. In other words, the communicating openings 462 are separated by the middle barrier 4622. The outlet opening 464 matches the outlet 384 of the water block set cover 38. The communicating opening 462 may be designed in other shapes and sizes, as long as cooling liquid is able to be contained in the flow-directing containment area 44 and freely flow through the communicating openings 462 of the liquid pump module cover 46, the inlet 382 of the water block set cover 38, and the middle longitudinal split opening 362 of the encasement 36 and then out from the outlet 384 of the water block set cover 38, the liquid pump module cover 46 and back into the flow-directing containment area 44. The liquid pump module cover 46 may be made of, for example, plastic or metal.

Referring to FIGS. 2 to 4 again, in the first embodiment, the flow-directing containment area 24 is arranged between the casing 22 and the liquid pump module cover 26, and mounted on the water block set 10. The flow-directing containment area 24 has a flow-directing containment area body 242, a first pump 244, a second pump 246, and a flow-directing containment plate 248. The flow-directing containment area body 242 has a first flow-directing containment recess 2422, a second flow-directing containment recess 2424, a cooling liquid outlet 2426, and a cooling liquid inlet 2428. The cooling liquid outlet 2426 and the cooling liquid inlet 2428 may be arranged at the same side of the flow-directing containment area body 242, and said side is defined as a near side or a near end. Another side of the flow-directing containment area body 242 opposite the near side is defined as a far side or a far end. The first flow-directing containment recess 2422 is near the near side of the casing 22 and the second flow-directing containment recess 2424 is near the far side of the casing 22. The first flow-directing containment recess 2422 and the second flow-directing containment recess 2424 are concaved upward from a bottom side of the flow-directing containment area body 242. In other words, the first and second flow-directing containment recesses 2422, 2424 are on a surface of the flow-directing containment area body 242 that faces the water block set 10 and are concaved away from the water block set 10. The cooling liquid may flow into and out of the flow-directing containment area 24 via the cooling liquid outlet 2426 and the cooling liquid inlet 2428 respectively. The cooling liquid outlet 2426 communicates with the outlet 184 of the water block set 10.

The first pump 244 has a first stator assembly 244S and a first impeller 244I. The first stator assembly 244S is mounted on a top side of the flow-directing containment area body 242 and corresponds to the first flow-directing containment recess 2422 in location. The first impeller 244I has a plurality of curved blades and is positioned within the first flow-directing containment recess 2422. Therefore, a size of the first flow-directing containment recess 2422 corresponds to the diameter of the first impeller 244I. The second pump 246 has a second stator assembly 246S and a second impeller 246I. The second stator assembly 246S is mounted on a top side of the flow-directing containment area body 242 and corresponds to the second flow-directing containment recess 2424 in location. The second impeller 246I has a plurality of curved blades and the second impeller 246I is positioned within the second flow-directing containment recess 2424 and slightly offset by the first impeller 244I. A size of the flow-directing containment area body 242 corresponds to the diameter of the second impeller 246I of the second pump 246. Therefore, in this embodiment, the flow-directing containment area body 242 has two flow-directing containment recesses and two pumps. The flow-directing containment plate 248 is mounted between the impellers 244I, 246I and the water block set 10, and further between the impellers 244I, 246I and the liquid pump module cover 26. The cooling liquid inlet cutout 222 and one of the two flow-directing containment recesses 2422/2424 communicate with each other via the flow-directing containment plate 248, the other one of the flow-directing containment recesses 2422/2424 communicates with one of the openings 262/264, and the two flow-directing containment recesses 2422/2424 communicate with each other in series via the flow-directing containment plate 248.

In the first embodiment, the flow-directing containment plate 248 has an inlet channel 2481, a communicating channel 2482, and an outlet channel 2483. The first end of the inlet channel 2481 communicates with the cooling liquid inlet 2428, a second end of the inlet channel 2481 communicates with one of the flow-directing containment recesses 2422/2424, which precisely is the second flow-directing containment recess 2424 in this embodiment. Two ends of the communicating channel 2482 respectively communicate with the two flow-directing containment recesses 2422/2424. A first end of the outlet channel 2483 communicates with the other one of the flow-directing containment recesses 2422/2424, i.e., the first flow-directing containment recess 2422 in this embodiment. A second end of the outlet channel 2483 communicates with the communicating opening 262 of the liquid pump module cover 26. In another embodiment with more flow-directing containment recesses, the amount of the communicating channel 2482 is always less than that of flow-directing containment recess by one. Each communicating channel 2482 connects two of the flow-directing containment recesses, the inlet channel 2481 communicates with the first one of the flow-directing containment recess, and the outlet channel 2483 communicates with the last one of the flow-directing containment recesses.

Precisely, the flow-directing containment plate 248 comprises an inlet channel opening 248A, a first opening 248B, an outlet channel opening 248C, a first partition 248D, a second opening 248E, and a second partition 248F. The inlet channel opening 248A and the outlet channel opening 248C may be formed on an edge of the flow-directing containment plate 248. The first opening 248B and the second opening 248E are formed through the flow-directing containment plate 248, which allows the cooling liquid on a lower surface of the flow-directing containment plate 248 to flow upward to the first flow-directing containment recess 2422 and the second flow-directing containment recess 2424. The outlet channel opening 248C, the outlet opening 264 of the liquid pump module cover 26, and the outlet 184 of the water block set 10 are aligned to each other, which allows the cooling liquid to flow to the cooling liquid outlet 2426 via the outlet channel opening 248C after flowing out of the water block set 10 and entering the outlet opening 264. The first partition 248D separates the inlet channel opening 248A, the first opening 248B, and the outlet channel opening 248C from each other. The second partition 248F encloses the outlet channel 2483 so that the outlet channel 2483 is separate from the inlet channel 2481. The outlet channel 2483 comprises an entrance channel end 248G and an exit channel end 248H. The exit channel end 248H is aligned to the communicating opening 262 of the liquid pump module cover 26.

In the second embodiment, the flow-directing containment plate 448 has an inlet channel 4481 and a plurality of outlet channels 4483 on a surface of the flow-directing containment plate 448 that faces the water block set 30. A first end of the inlet channel 4481 communicates with the cooling liquid inlet 4428 and a second end of the inlet channel 4481 communicates with all of the flow-directing containment recesses 4422/4424. A first end of the outlet channel 4483 communicates with one of the flow-directing containment recesses 4422/4424 and a second end of the outlet channel 4483 communicates with the inlet 382 of the water block set 30 via one of communicating openings 462 of the liquid pump module cover 46. However, the embodiments are not limited thereto.

Precisely, the flow-directing containment plate 448 further comprises a second partition and an additional third partition 448A enclosing the outlet channels 4483 respectively, but does not have any first partition. Similar to the second partition, the third partition 448A also comprises an entrance channel end 448B and an exit channel end 448C. The exit channel end of the second partition and the exit channel end 448C of the third partition 448A are aligned to the communicating openings 462 respectively. The communicating openings 462 are separated by the middle barrier 4622 of the liquid pump module cover 46.

Figure 6A:
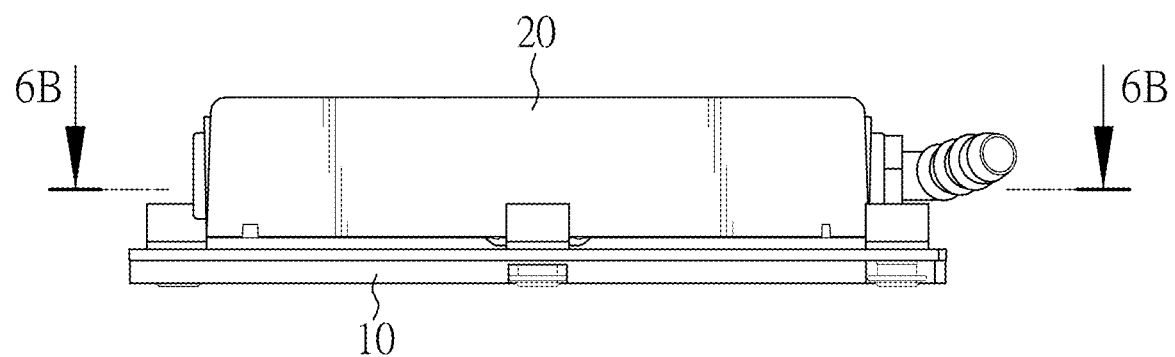
FIG. 6A is a side view of the liquid cooling heat exchange apparatus in FIG. 1.
Figure 6B:
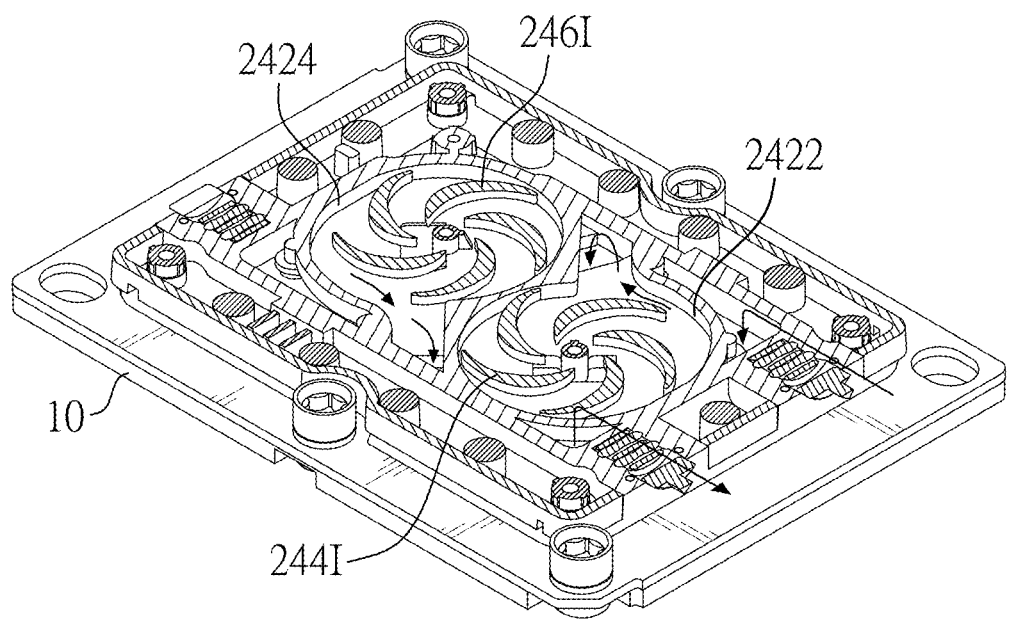
FIG. 6B is a sectional view of the liquid cooling heat exchange apparatus in FIG. 6A across line 6B-6B.
Figure 7A:
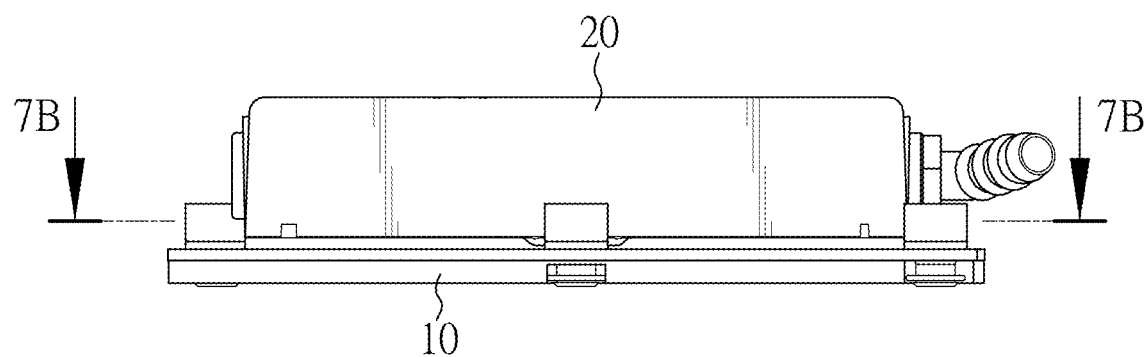
FIG. 7A is a side view of the liquid cooling heat exchange apparatus in FIG. 1.
Figure 7B:
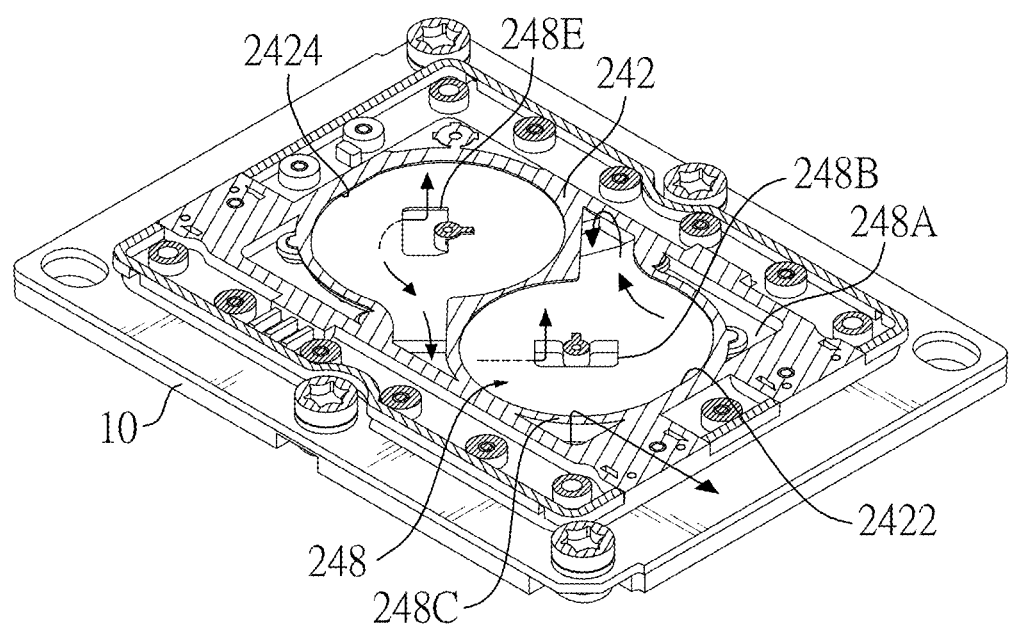
FIG. 7B is a sectional view of the liquid cooling heat exchange apparatus in FIG. 7A across line 7B-7B.
Figure 8A:
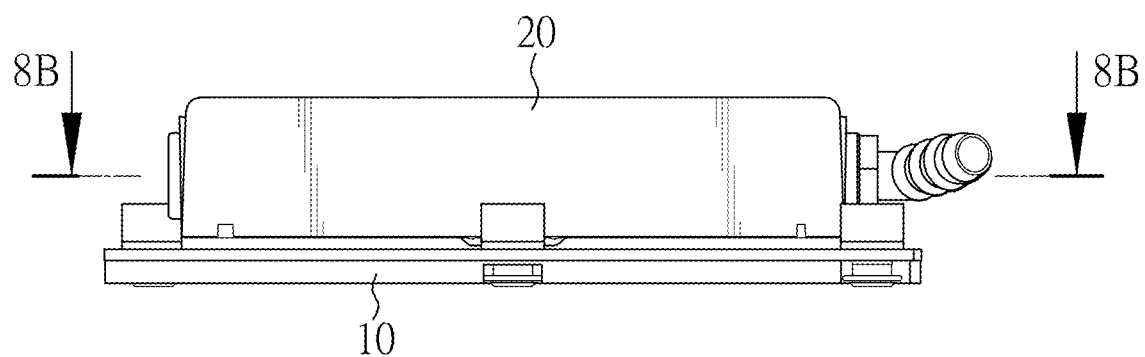
FIG. 8A is a side view of the liquid cooling heat exchange apparatus in FIG. 1.
Figure 8B:
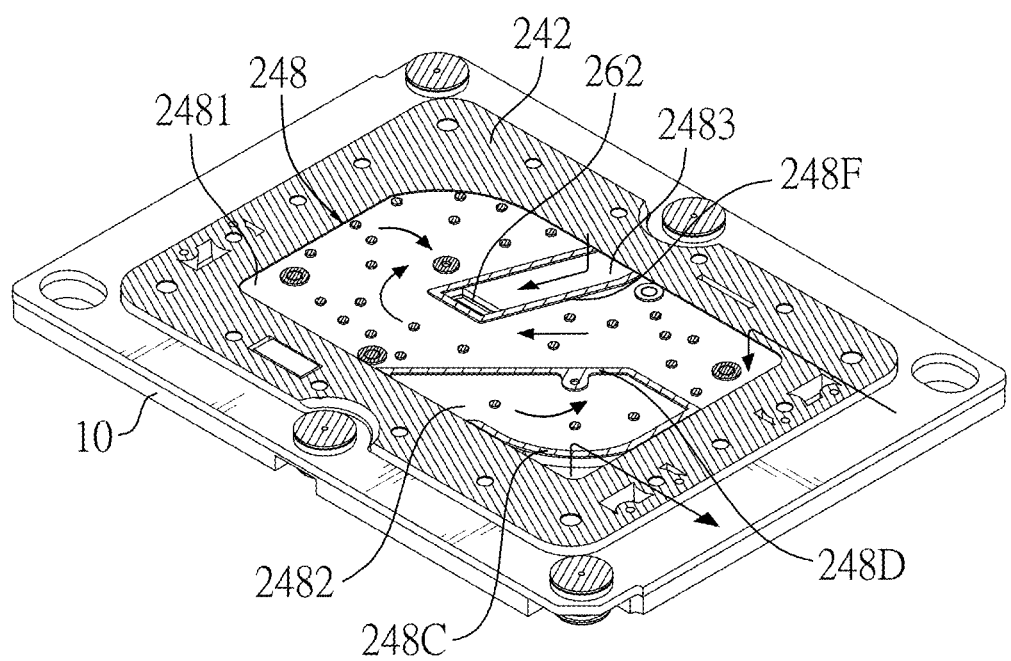
FIG. 8B is a sectional view of the liquid cooling heat exchange apparatus in FIG. 8A across line 8B-8B.
Figure 9:
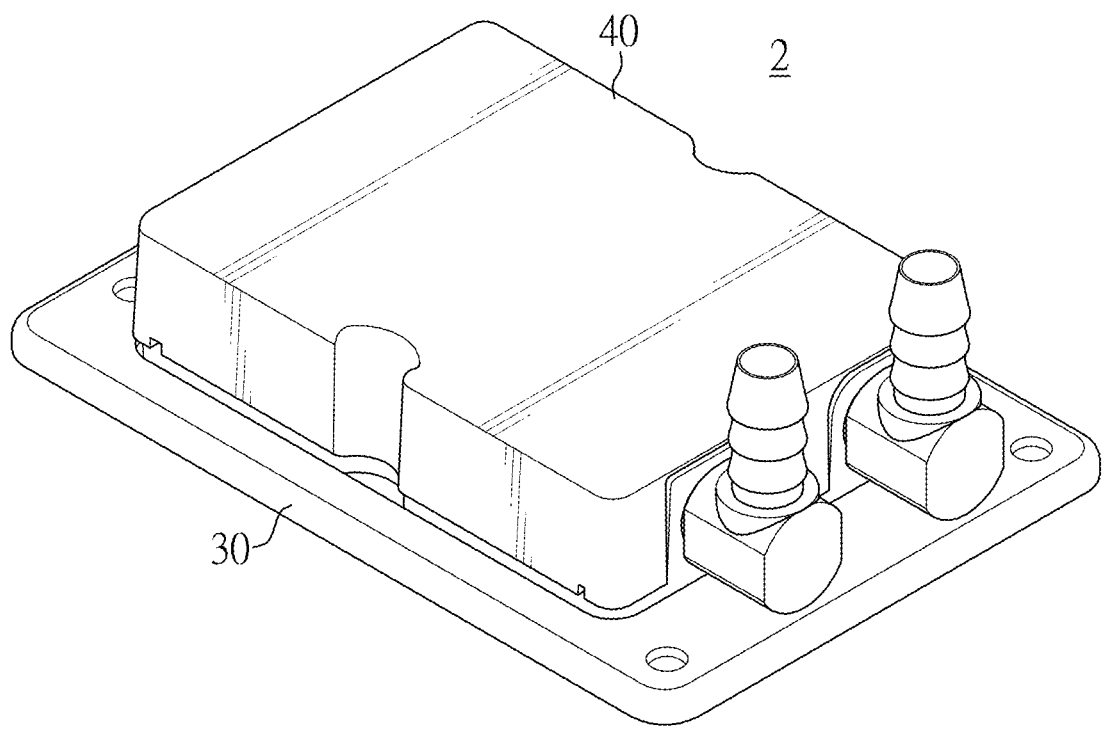
FIG. 9 is a perspective view of a liquid cooling heat exchange apparatus in accordance with a second embodiment of the present invention.

In the first embodiment, the flow-directing containment area body 242 and flow-directing containment plate 248 consist of channel passages to direct cooling liquid throughout the liquid pump module 20 to the water block set 10. The first flow-directing containment recess 2422 corresponds to a flow-directing containment outlet area and a cooling liquid outlet 2426, and the second flow-directing containment recess 2424 corresponds to a flow-directing containment inlet area and a cooling liquid inlet 2428. As shown in FIG. 6B, the first flow-directing containment recess 2422 and the second flow-directing containment recess 2424 are provided with at least one cooling liquid inlet and at least one cooling liquid outlet disposed on the same side for cooling liquid to flow to and from, respectively, the channels. However, the embodiments are not limited thereto. An alternative cooling liquid inlet may be disposed on an opposing side and aligned with the at least one cooling liquid outlet, according to different designs and specifications for cooling liquid to flow to and from, respectively, the channels.

Note that while two pumps 244, 246 are implemented for the liquid cooling heat exchange apparatus 1 of the embodiments, more than two pumps or one pump may also be implemented for achieving liquid heat exchange of a CPU or any other processing unit. The flow-directing containment area body 242, the first stator assembly 244S and the second stator assembly 246S, and the flow-directing containment plate 248 may be made of, for example, plastic or metal.

The impellers of the pump have a shape and a design intended only for one way rotation, as in the embodiments only a clockwise rotation is shown. Thereby, the efficiency of the impellers of the pump is highly increased compared to impellers capable of and intended for both clockwise and counterclockwise rotation.

Then please refer to FIGS. 2 and 5A to 8B. In the first embodiment, after the cooling liquid enters the flow-directing containment area body 242 through a liquid-tight connection inlet tube and the cooling liquid inlet 2428 thereof, the cooling liquid passes through the inlet channel opening 248A and then arrives at a lower surface of the flow-directing containment plate 248 and flows into the inlet channel 2481. Then, guided by the inlet channel 2481, the cooling liquid passes through the second opening 248E and then arrives at the second impeller 246I of the second pump 246 on an upper surface of the flow-directing containment plate 248. The cooling liquid is then pumped to the communicating channel 2482 under the flow-directing containment plate 248 and passes through the first opening 248B under guiding by the communicating channel 2482, and then arrives at the first impeller 244I of the first pump 244 on the upper surface of the flow-directing containment plate 248. From there, the cooling liquid is then pumped to the outlet channel 2483 on the lower surface of the flow-directing containment plate 248, and then passes through the outlet channel 2483 and the communicating opening 262 of the liquid pump module cover 26. In the first embodiment, via the communicating opening 262, the cooling liquid is then pumped down into the communicating opening 182 of the water block set cover 18 and correspondingly into the middle longitudinal split opening 162 of the encasement 16. Therefore, the cooling liquid is forced to flow through the heat-dissipating fins of the main heat transfer area 1244 and absorbs heat before exiting the encasement 16. Finally, the cooling liquid flows through the outlet 184 of the water block set cover 18 and the outlet opening 264 of the liquid pump module cover 26, and then passes through the outlet channel opening 248C and is exhausted from the cooling liquid outlet 2426 and then to a liquid-tight connection outlet tube connected thereto.

Then please refer to FIGS. 10 and 13A to 16B; a flow path of the cooling liquid of the second embodiment is similar to that of the first embodiment, but the cooling liquid may flow to every pump after flowing out of the inlet channel 4481, then flow to the communicating openings 462 of the liquid pump module covers 46 under guiding by the outlet channels 4483 respectively, and flow into the water block set 30 via the inlet 382 of the water block set cover 38 and exchange heat. Therefore, in the second embodiment, the pumps are connected in parallel.

In the embodiments, the liquid pump module 20, 40 pumps a cooling liquid to flow into the first pump 244, 444 of the flow-directing containment area 24 or the first pump of the flow-directing containment area 44 via an inlet connection tube attached to the liquid pump module 20, 40, and passes the heat-dissipating fins in the second-level indented water block heat exchange area 1242 of the second surface 124 of the water block base 12 to an outlet tube connection attached to the liquid pump module 20, 40. The water block base 12 is in thermal contact with the CPU or processing unit. Channels or segments establish an efficient and smooth swirling flow-path for the cooling liquid through the liquid pump module 20, 40.

The water block set 10, 30 and the liquid pump module 20, 40 may be fixed to a CPU or any other processing unit by any suitable means such as soldering, brazing or by means of thermal paste combined with glue. Alternatively, other means, such as a fastening means, may be provided for ensuring thermal contact between the free surface of the CPU or any other processing unit and the liquid cooling heat exchange apparatus.

The liquid pump module 20 or any other parts of the liquid cooling heat exchange apparatus 1, which are possibly manufactured from a plastic material, may be "metalized" in order to minimize liquid diffusion or evaporation of the liquid. The metal may be provided as a thin layer of metal coating provided on either or on both of the internal side or/and the external side of the plastic part.

The cooling liquid of the liquid cooling heat exchange apparatus 1 may be any type of cooling liquid such as water, water with additives such as anti-fungicide, water with additives for improving heat conductivity or other special compositions of cooling liquids such as electrically non-conductive liquids or liquids with lubricant additives or anti-corrosive additives. Control of a pump driven by an AC electrical motor, preferably takes place by means of the operating system or like means of the computer system itself, wherein the operating system comprises a means for measuring the CPU load and/or the CPU temperature. Using the measurement performed by the operating system or a like system of the computer system eliminates the need for special means for operating the pump. Communication between the operating system or a like system and a processor for operating the pump may take place along already established communication links in the computer system such as a USB-link. Thereby, real-time communication between the cooling system and the operating system may be provided without any special means for establishing the communication.

Further control strategies utilizing the operating system or a like system of the computer system may involve balancing the rotational speed of the pump as a function of the cooling capacity needed. If a lower cooling capacity is needed, the rotational speed of the pump may be limited, thereby limiting the noise generated by the motor driving the pump.

The pump is not being restricted to a mechanical component, but can be in any form capable of pumping the cooling liquid through the device. However, the pump is preferably one of the following types of mechanical pumps: bellows pump, centrifugal pump, diaphragm pump, drum pump, flexible liner pump, flexible impeller pump, gear pump, peristaltic tubing pump, piston pump, processing cavity pump, pressure washer pump, rotary lobe pump, rotary vane pump and electro-kinetic pump. Similarly, the motor driving the pumping member need not be electrical but may also be a piezo-electrically operated motor, a permanent magnet operated motor, a fluid-operated motor or a capacitor-operated motor. The choice of pumps and the choice of motors driving the pump are dependent on many different parameters, and it is up to the person skilled in the art to choose the type of pump and the type of motor depending on the specific application. As an example, some pumps and some motors are better suited for small computer systems such as laptops, some pumps and some motors are better suited for establishing high flow of the cooling liquid and thus a high cooling effect, and even some pumps and motors are better suited for ensuring a low-noise operation of the liquid cooling heat exchange apparatus.

The increased efficiency of the impeller design results in the electric motor (not shown) driving the impeller of the pump possibly being smaller than otherwise needed for establishing a proper and sufficient flow of cooling liquid through the channels. In a preferred embodiment, the electric motor is an AC motor, preferably a 2V AC motor; however, the embodiments are not limited thereto. Other forms or means of electrical power may be used.

Figure 17:
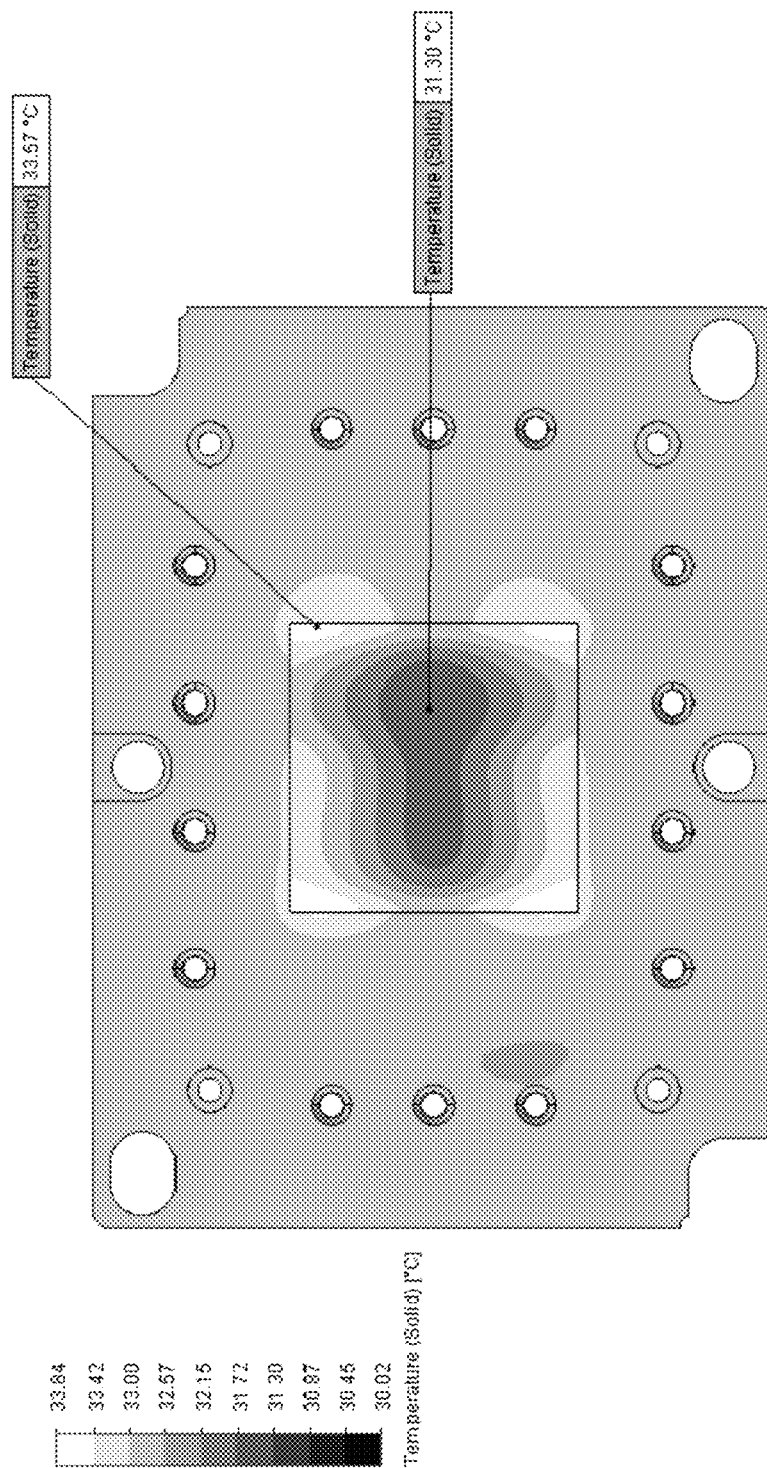
FIG. 17 is a temperature distribution diagram of the liquid cooling heat exchange apparatus in FIG. 1 in an experiment.
Figure 18:
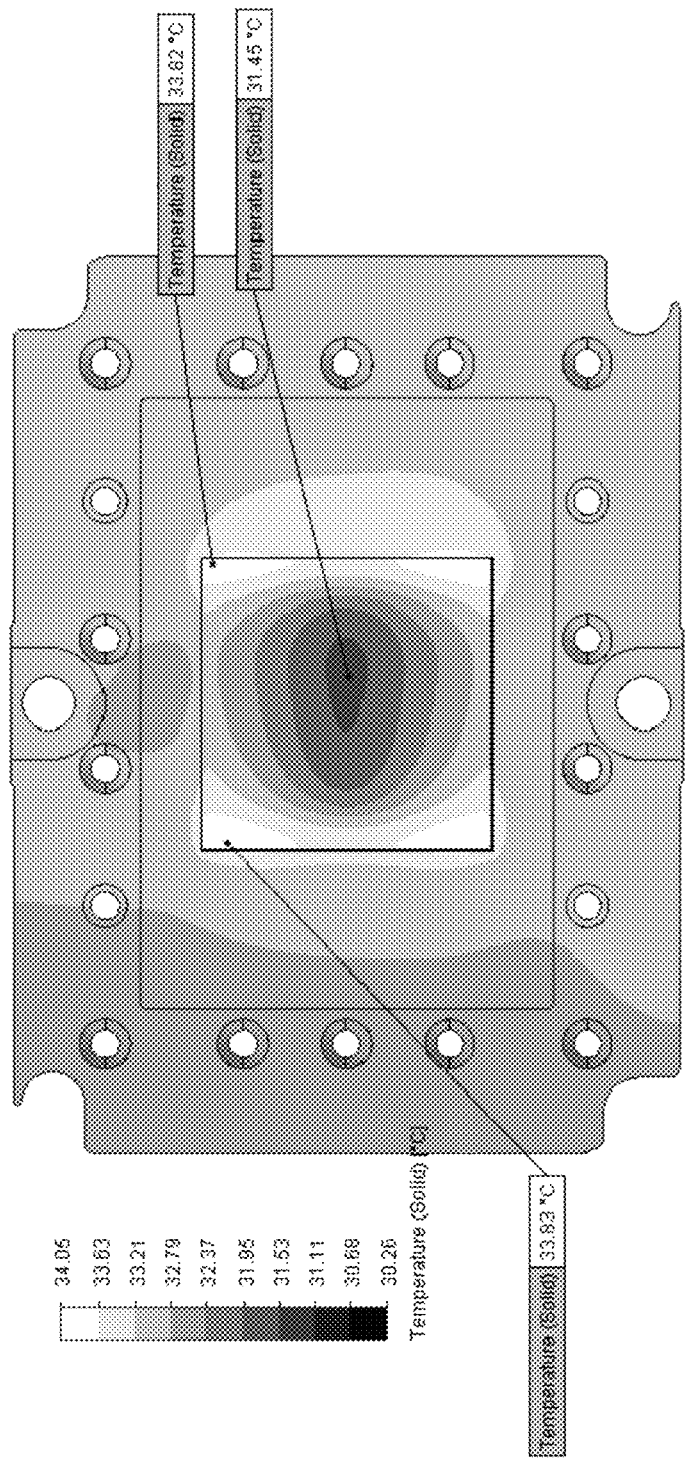
FIG. 18 is a temperature distribution diagram of the liquid cooling heat exchange apparatus in FIG. 9 in an experiment.

Liquid heat exchange devices may be less noisy and more efficient than an air-cooling device. The liquid cooling heat exchange apparatuses and heat removal or transfer methods of the embodiments minimize components through modulation, which decreases total installation time, risks for leakage, and loss of parts. Additionally, liquid flow and heat dissipation efficiency are increased through a design of the liquid cooling heat exchange apparatuses. As shown in FIG. 17, a power of Heat Source is 160 W, and temperature of working flow is 30° C. While the liquid cooling heat exchange apparatus 1 is applied for heat exchanging, the thermal resistance Rca=(31.46−30)/160 W=0.009125° C./W. As shown in FIG. 18, power of Heat Source is 160 W, and temperature of working flow is 30° C. While the liquid cooling heat exchange apparatus 2 is applied for heat exchanging, the thermal resistance Rca=(31.3−30)/160 W=0.008125° C./W.

With the liquid cooling heat exchange apparatus 1/2 of the present invention comprising the water block set cover 18/38 and the liquid pump module cover 26/46, the water block set 10/30 and the liquid pump module 20/40 form a closed inner chamber respectively, the inner chamber of the water block set 10/30 may communicate with exterior thereof via the inlet 182/382 of the water block set cover 18/38 and the outlet opening 264/464, and the inner chamber of the liquid pump module 20/40 communicates with exterior thereof via the outlet opening 264/464 and the communicating opening 262/462 of the liquid pump module cover 26/46. Besides, the water block set 10/30 may only form a seam at where the water block base 12/32 is mounted on the water block set cover 18/38, and the liquid pump module 20/40 may only form a seam at where the casing 22/42 is mounted on the liquid pump module cover 26/46, so a risk of the cooling liquid leaking is very low. Furthermore, with the inlet 182/382 of the water block set cover 18/38 aligned to the communicating opening 262/462 of the liquid pump module cover 26/46 and the outlet 184/384 of the water block set cover 18/38 aligned to the outlet opening 264/464 of the liquid pump module cover 26/46, the inner chambers of the water block set 10/30 and the liquid pump module 20/40 communicate with each other after the water block set 10/30 and the liquid pump module 20/40 are mounted together. In addition, the water block set and the liquid pump module are modularized, so the water block set in any embodiment can be mounted on the liquid pump module in any embodiment, so that the user can assemble the liquid cooling heat exchange apparatus according to different working conditions.

The pumps of the liquid cooling heat exchange apparatus of the present invention are connected in series and parallel via the flow-directing containment area, which allows the pumps to juxtapose with each other rather than be piled axially, and thus a thickness of the liquid cooling heat exchange apparatus may be narrow and the liquid cooling heat exchange apparatus can be equipped at a narrow space. Besides, with the connecting pumps, the flow speed and the amount of the flow of the cooling liquid may be improved, so the liquid cooling heat exchange apparatus of the present invention can be equipped on a high heat efficiency source. In addition, even if part of the pumps malfunctions, the remaining pump(s) can maintain a basic amount and speed of the flow, and thereby a maintenance staff may have adequate time to troubleshoot.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A liquid cooling heat exchange apparatus configured to be flow through by a cooling liquid and comprising:
   a water block set comprising:
   a heat transfer surface configured to exchange heat with the cooling liquid;
   an inlet; wherein the cooling liquid flows into the water block set via the inlet of the water block set and then passes through the heat transfer surface; and
   an outlet; wherein the cooling liquid flows out of the water block set via the outlet of the water block set; and
   a liquid pump module securely mounted on the water block set and comprising:
   a flow-directing containment area securely mounted on the water block set and comprising a flow-directing containment area body forming:
   a plurality of flow-directing containment recesses being on a surface, facing the water block set, of the flow-directing containment area body and concaved away from the water block set;
a cooling liquid outlet communicating with the outlet of the water block set; and
a cooling liquid inlet;
a plurality of pumps corresponding to the flow-directing containment recesses in location respectively; each one of the pumps comprising an impeller in a respective one of the flow-directing containment recesses; and
a flow-directing containment plate disposed between the impellers of the pumps and the water block set and covering the flow-directing containment recesses; the flow-directing containment plate comprising:
an inlet channel on a surface, facing the water block set, of the flow-directing containment plate; the cooling liquid inlet of the flow-directing containment area body communicating with at least one of the flow-directing containment recesses via the inlet channel; and
at least one outlet channel on the surface, facing the water block set, of the flow-directing containment plate; the flow-directing containment recesses communicating with the inlet of the water block set via the at least one outlet channel,
wherein:
the at least one outlet channel of the flow-directing containment plate includes multiple outlet channels, and
each of the flow-directing containment recesses communicate with the inlet of the water block set via one of the multiple outlet channels.

2. The liquid cooling heat exchange apparatus as claimed in claim 1, wherein the flow-directing containment plate further comprises:
least one communicating channel communicating with two of the flow-directing containment recesses, and thereby the at least one communicating channel;
wherein:
the inlet channel of the flow-directing containment plate communicates with the cooling liquid inlet and with only one of the flow-directing containment recesses; and
the at least one outlet channel of the flow-directing containment plate communicates with only another one of the flow-directing containment recesses, and with the inlet of the water block set.

3. The liquid cooling heat exchange apparatus as claimed in claim 2, wherein:
the plurality of pumps includes two pumps;
the plurality of flow-directing containment recesses includes two flow-directing containment recesses;
the cooling liquid inlet and the cooling liquid outlet are at a near side of the flow-directing containment area body;
the two flow-directing containment recesses are respectively comprise:
a first flow-directing containment recess adjacent to the near side; and
a second flow-directing containment recess adjacent to the far side of the flow-directing containment area body, opposite to the near side;
the inlet channel communicates with the second flow-directing containment recess; and
the outlet channel communicates with the first flow-directing containment recess.

4. The liquid cooling heat exchange apparatus as claimed in claim 1, wherein:
the cooling liquid inlet communicates with the plurality of flow-directing containment recesses via the inlet channel of the flow-directing containment plate, whereby the flow-directing containment recesses are connected in parallel.

5. The liquid cooling heat exchange apparatus as claimed in claim 1, wherein the water block set comprises:
a water block base having the aforesaid heat transfer surface; and
a water block set cover sealed on the water block base, completely covering the heat transfer surface, and comprising:
the aforesaid inlet and outlet of the water block set; the cooling liquid being capable of flowing into a space between the water block set cover and the water block base via the inlet of the water block set and flowing out via the outlet of the water block set.

6. The liquid cooling heat exchange apparatus as claimed in claim 5, wherein the water block set further comprises:
an encasement completely covering the heat transfer surface and forming: a middle longitudinal split opening aligned to the heat transfer surface and communicating with the inlet of the water block set cover.

7. The liquid cooling heat exchange apparatus as claimed in claim 5, wherein the water block base forms:
a first-level indented water block heat exchange area concaved away from the liquid pump module; and
a main heat transfer area in the first-level indented water block heat exchange area.

8. The liquid cooling heat exchange apparatus as claimed in claim 7, wherein the water block base further forms:
a second-level indented water block heat exchange area being in the first-level indented water block heat exchange area and concaved away from the liquid pump module; the main heat transfer area being in the second-level indented water block heat exchange area.

9. The liquid cooling heat exchange apparatus as claimed in claim 5, wherein the water block base forms:
a ramp being in the first-level indented water block heat exchange area and adjoining the heat transfer surface.

10. The liquid cooling heat exchange apparatus as claimed in claim 1, wherein:
the liquid pump module further comprises:
a liquid pump module cover securely mounted on the flow-directing containment area body and between the flow-directing containment plate and the water block set; the liquid pump module comprising:
at least one communicating opening; the at least one outlet channel of the flow-directing containment plate communicating with the inlet of the water block set via the at least one communicating opening; and
an outlet opening; the outlet of the water block set cover communicating with the cooling liquid outlet of the flow-directing containment area body via the outlet opening.

11. A liquid cooling heat exchange apparatus configured to be flow through by a cooling liquid and comprising:
a water block set comprising:
a heat transfer surface configured to exchange heat with the cooling liquid;
an inlet; wherein the cooling liquid flows into the water block set via the inlet of the water block set and then passes through the heat transfer surface; and
an outlet; wherein the cooling liquid flows out of the water block set via the outlet of the water block set; and a liquid pump module securely mounted on the water block set and comprising:
a flow-directing containment area securely mounted on the water block set and comprising a flow-directing containment area body forming:
a plurality of flow-directing containment recesses being on a surface, facing the water block set, of the flow-directing containment area body and concaved away from the water block set;
a cooling liquid outlet communicating with the outlet of the water block set; and
a cooling liquid inlet;
a plurality of pumps corresponding to the flow-directing containment recesses in location respectively; each one of the pumps comprising an impeller in a respective one of the flow-directing containment recesses; and
a flow-directing containment plate disposed between the impellers of the pumps and the water block set and covering the flow-directing containment recesses; the flow-directing containment plate comprising:
an inlet channel on a surface, facing the water block set, of the flow-directing containment plate; the cooling liquid inlet of the flow-directing containment area body communicating with at least one of the flow-directing containment recesses via the inlet channel; and
at least one outlet channel on the surface, facing the water block set, of the flow-directing containment plate; the flow-directing containment recesses communicating with the inlet of the water block set via the at least one outlet channel,
wherein the water block set comprises:
a water block base having the aforesaid heat transfer surface;
a water block set cover sealed on the water block base, completely covering the heat transfer surface, and comprising the inlet and outlet of the water block set; the cooling liquid being capable of flowing into a space between the water block set cover and the water block base via the inlet of the water block set and flowing out via the outlet of the water block set; and
an encasement completely covering the heat transfer surface and forming: a middle longitudinal split opening aligned to the heat transfer surface and communicating with the inlet of the water block set cover.

12. A liquid cooling heat exchange apparatus configured to be flow through by a cooling liquid and comprising:
a water block set comprising:
a heat transfer surface configured to exchange heat with the cooling liquid;
an inlet; wherein the cooling liquid flows into the water block set via the inlet of the water block set and then passes through the heat transfer surface; and
an outlet; wherein the cooling liquid flows out of the water block set via the outlet of the water block set; and
a liquid pump module securely mounted on the water block set and comprising:
a flow-directing containment area securely mounted on the water block set and comprising a flow-directing containment area body forming:
a plurality of flow-directing containment recesses being on a surface, facing the water block set, of the flow-directing containment area body and concaved away from the water block set;
a cooling liquid outlet communicating with the outlet of the water block set; and
a cooling liquid inlet;
a plurality of pumps corresponding to the flow-directing containment recesses in location respectively; each one of the pumps comprising an impeller in a respective one of the flow-directing containment recesses; and
a flow-directing containment plate disposed between the impellers of the pumps and the water block set and covering the flow-directing containment recesses; the flow-directing containment plate comprising:
an inlet channel on a surface, facing the water block set, of the flow-directing containment plate; the cooling liquid inlet of the flow-directing containment area body communicating with at least one of the flow-directing containment recesses via the inlet channel; and
at least one outlet channel on the surface, facing the water block set, of the flow-directing containment plate; the flow-directing containment recesses communicating with the inlet of the water block set via the at least one outlet channel,
wherein the water block set comprises:
a water block base having the aforesaid heat transfer surface; and
a water block set cover sealed on the water block base, completely covering the heat transfer surface, and comprising the inlet and outlet of the water block set; the cooling liquid being capable of flowing into a space between the water block set cover and the water block base via the inlet of the water block set and flowing out via the outlet of the water block set; and
wherein the water block base forms:
a first-level indented water block heat exchange area concaved away from the liquid pump module; and
a main heat transfer area in the first-level indented water block heat exchange area.

13. The liquid cooling heat exchange apparatus as claimed in claim 12, wherein the water block base further forms a second-level indented water block heat exchange area being in the first-level indented water block heat exchange area and concaved away from the liquid pump module, the main heat transfer area being in the second-level indented water block heat exchange area.

14. A liquid cooling heat exchange apparatus configured to be flow through by a cooling liquid and comprising:
a water block set comprising:
a heat transfer surface configured to exchange heat with the cooling liquid;
an inlet; wherein the cooling liquid flows into the water block set via the inlet of the water block set and then passes through the heat transfer surface; and
an outlet; wherein the cooling liquid flows out of the water block set via the outlet of the water block set; and
a liquid pump module securely mounted on the water block set and comprising:
a flow-directing containment area securely mounted on the water block set and comprising a flow-directing containment area body forming:
a plurality of flow-directing containment recesses being on a surface, facing the water block set, of the flow-directing containment area body and concaved away from the water block set;
a cooling liquid outlet communicating with the outlet of the water block set; and
a cooling liquid inlet;
a plurality of pumps corresponding to the flow-directing containment recesses in location respectively; each one of the pumps comprising an impeller in a respective one of the flow-directing containment recesses; and
a flow-directing containment plate disposed between the impellers of the pumps and the water block set and covering the flow-directing containment recesses; the flow-directing containment plate comprising:
an inlet channel on a surface, facing the water block set, of the flow-directing containment plate; the cooling liquid inlet of the flow-directing containment area body communicating with at least one of the flow-directing containment recesses via the inlet channel; and
at least one outlet channel on the surface, facing the water block set, of the flow-directing containment plate; the flow-directing containment recesses communicating with the inlet of the water block set via the at least one outlet channel,
wherein the water block set comprises:
a water block base having the aforesaid heat transfer surface; and
a water block set cover sealed on the water block base, completely covering the heat transfer surface, and comprising the inlet and outlet of the water block set; the cooling liquid being capable of flowing into a space between the water block set cover and the water block base via the inlet of the water block set and flowing out via the outlet of the water block set; and
wherein the water block base forms a ramp being in the first-level indented water block heat exchange area and adjoining the heat transfer surface.

15. A liquid cooling heat exchange apparatus configured to be flow through by a cooling liquid and comprising:
a water block set comprising:
a heat transfer surface configured to exchange heat with the cooling liquid;
an inlet; wherein the cooling liquid flows into the water block set via the inlet of the water block set and then passes through the heat transfer surface; and
an outlet; wherein the cooling liquid flows out of the water block set via the outlet of the water block set; and a liquid pump module securely mounted on the water block set and comprising:
a flow-directing containment area securely mounted on the water block set and comprising a flow-directing containment area body forming:
a plurality of flow-directing containment recesses being on a surface, facing the water block set, of the flow-directing containment area body and concaved away from the water block set;
a cooling liquid outlet communicating with the outlet of the water block set;
a cooling liquid inlet; and
a liquid pump module cover securely mounted on the flow-directing containment area body and between the flow-directing containment plate and the water block set; the liquid pump module comprising:
at least one communicating opening; the at least one outlet channel of the flow-directing containment plate communicating with the inlet of the water block set via the at least one communicating opening; and
an outlet opening; the outlet of the water block set cover communicating with the cooling liquid outlet of the flow-directing containment area body via the outlet opening
a plurality of pumps corresponding to the flow-directing containment recesses in location respectively; each one of the pumps comprising an impeller in a respective one of the flow-directing containment recesses; and
a flow-directing containment plate disposed between the impellers of the pumps and the water block set and covering the flow-directing containment recesses; the flow-directing containment plate comprising:
an inlet channel on a surface, facing the water block set, of the flow-directing containment plate; the cooling liquid inlet of the flow-directing containment area body communicating with at least one of the flow-directing containment recesses via the inlet channel; and
at least one outlet channel on the surface, facing the water block set, of the flow-directing containment plate; the flow-directing containment recesses communicating with the inlet of the water block set via the at least one outlet channel.

* * * * *